(12) United States Patent
Naaman et al.

(10) Patent No.: US 9,780,765 B2
(45) Date of Patent: Oct. 3, 2017

(54) JOSEPHSON CURRENT SOURCE SYSTEMS AND METHOD

(71) Applicants: Ofer Naaman, Ellicott City, MD (US); Quentin P. Herr, Ellicott City, MD (US)

(72) Inventors: Ofer Naaman, Ellicott City, MD (US); Quentin P. Herr, Ellicott City, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 63 days.

(21) Appl. No.: 14/564,962

(22) Filed: Dec. 9, 2014

(65) Prior Publication Data
US 2016/0164505 A1 Jun. 9, 2016

(51) Int. Cl.
*H03K 3/38* (2006.01)
*H01L 39/22* (2006.01)
*G06N 99/00* (2010.01)

(52) U.S. Cl.
CPC ............ *H03K 3/38* (2013.01); *G06N 99/002* (2013.01); *H01L 39/223* (2013.01)

(58) Field of Classification Search
CPC .... B82Y 10/00; H03K 17/19; H03K 19/0008; H03K 19/195; H03K 19/1952; H03K 19/1954; H03K 5/38; G06N 99/002; H01L 39/223
USPC .................................. 327/517–528; 326/3–5
See application file for complete search history.

(56) References Cited

U.S. PATENT DOCUMENTS

| | | | |
|---|---|---|---|
| 4,621,203 A | 11/1986 | Sweeny | |
| 5,019,818 A * | 5/1991 | Lee | H03M 1/48 327/186 |
| 5,114,912 A | 5/1992 | Benz | |
| 5,151,617 A * | 9/1992 | Goto | H03K 19/1952 326/3 |
| 5,153,171 A | 10/1992 | Smith et al. | |
| 5,266,844 A * | 11/1993 | Ko | G06F 13/14 327/186 |

(Continued)

FOREIGN PATENT DOCUMENTS

JP  09198876 A  7/1997

OTHER PUBLICATIONS

Adler, et al.: (Jul. 1991). Broadband switched-bit phase shifter using all-pass networks. In *Microwave Symposium Digest, 1991., IEEE MTT-S International* (pp. 265-268). IEEE.

(Continued)

*Primary Examiner* — Dinh T Le
(74) *Attorney, Agent, or Firm* — Tarolli, Sundheim, Covell & Tummino LLP

(57) ABSTRACT

One embodiment describes a Josephson current source system. The system includes a flux-shuttle loop that is inductively coupled with an AC input signal. The flux-shuttle loop includes a plurality of Josephson junctions spaced about the flux-shuttle loop and being configured, when activated, to sequentially trigger the plurality of Josephson junctions about the flux-shuttle loop in response to the AC input signal to generate a DC output current provided through an output inductor. The system also includes a flux injector that is configured to selectively activate and deactivate the flux-shuttle loop in response to an input signal to control an amplitude of the DC output current.

20 Claims, 7 Drawing Sheets

(56) References Cited

U.S. PATENT DOCUMENTS

| | | | |
|---|---|---|---|
| 5,479,131 A | 12/1995 | Lee | |
| 5,936,458 A | 8/1999 | Rylov | |
| 6,348,699 B1 | 2/2002 | Zehe | |
| 6,833,693 B2 | 12/2004 | Andrews | |
| 6,917,216 B2 * | 7/2005 | Herr | H03F 19/00 326/3 |
| 7,498,832 B2 | 3/2009 | Baumgardner et al. | |
| 7,714,605 B2 | 5/2010 | Baumgardner et al. | |
| 7,724,020 B2 | 5/2010 | Herr | |
| 7,772,871 B2 | 8/2010 | Herr et al. | |
| 7,772,872 B2 | 8/2010 | Lewis | |
| 7,782,077 B2 | 8/2010 | Herr et al. | |
| 7,786,748 B1 | 8/2010 | Herr | |
| 7,893,703 B2 | 2/2011 | Rzepiela et al. | |
| 7,969,178 B2 | 6/2011 | Przybysz et al. | |
| 7,977,964 B2 | 7/2011 | Herr | |
| 8,022,722 B1 | 9/2011 | Pesetski et al. | |
| 8,242,799 B2 | 8/2012 | Pesetski et al. | |
| 8,270,209 B2 | 9/2012 | Herr et al. | |
| 8,489,163 B2 | 7/2013 | Herr et al. | |
| 8,654,578 B2 | 2/2014 | Lewis et al. | |
| 2006/0267709 A1 | 11/2006 | York | |
| 2009/0322374 A1 | 12/2009 | Przybysz et al. | |

OTHER PUBLICATIONS

Allman, et al.: "rf-SQUID-Mediated Coherent Tunable Coupling Between a Superconducting Phase Qubit and a Lumped-Element Resonator"; Physical Review Letters, 2010 The American Physical Society, PRL 104, week ending Apr. 30, 2010, pp. 177004-1 thru 177004-4.

Applied Superconductivity Conference, ASC 2008, Chicago, IL, USA, Aug. 17-22, 2008, Electronics Abstracts found at: http://www.ascinc.org/asc2008/uploads/2008Abstracts_Electronics.pdf.

Brummer, et al.: "Phase and Amplitude Modulator for Microwave Pulse Generation." *Applied Superconductivity, IEEE Transactions on* 21.3 (2011): 583-586.

Durand, et al.: (1992). The distributed Josephson inductance phase shifter.*Applied Superconductivity, IEEE Transactions on*, 2(1), 33-38.

EU FP6-502807 RSFQubit, RSFQ Control of Josephson Junctions Qubits, D7: Report on the Evaluation of the RSFQ Circuitry for Qubit Control, Sep. 1, 2005, pp. 1-16.

Hodges, et al.: "A precise analog phase shifter for SHF SATCOM phased arrays," *Gallium Arsenide Integrated Circuit (GaAs IC) Symposium, 1992. Technical Digest 1992., 14th Annual IEEE*, vol., No., pp. 29,32, Oct. 4-7, 1997 doi: 10.1109/GAAS.1992.247230.

Johnson, et al.: "*A Scalable Control System for a Superconducting Adiabatic Quantum Optimization Processor*"; arXiv:0907.3757v2 [quant-ph] Mar. 24, 2010, pp. 1-14.

Kaplunenko, et al.: 2004 *Supercond. Sci. Technol.* 17 S145. doi:10.1088/0953-2048/17/5/011, Published Feb. 19, 2004. IOP Publishing Ltd.

Kokkala, et al: *Quantum computing with itinerant microwave photons*(Doctoral dissertation, Aalto University). 2013.

Ohki, et al.: "*Low-Jc Rapid Single Flux Quantum (RSFQ) Qubit Control Circuit*"; IEEE Transactions on Applied Superconductivity, vol. 17, No. 2, Jun. 2007, pp. 154-157.

Rafique, et al.: *Miniaturized Superconducting Microwave Filters*, Superconoductor Science and Technology—IOPscience, http://iopsicence.iop.org/0953-2048/21/7/075004/pdf/0953-2048_21_7_075004.pdf.

Rafique, et al: Niobium tunable microwave filter. *Microwave Theory and Techniques, IEEE Transactions on*,57(5), 1173-1179.

Semenov et al. "*SFQ Control Circuits for Josephson Junction Qubits*"; IEEE Transactions on Applied Superconductivity, vol. 13, No. 2, Jun. 2003, pp. 960-965.

Herr, et al.: U.S. Appl. No. 14/044,220, filed Oct. 2, 2013, attached.
Herr, et al.: U.S. Appl. No. 13/585,467, filed Aug. 14, 2014, attached.
Herr, et al.: U.S. Appl. No. 14/325,518, filed Jul. 8, 2014, attached.
Naaman, et al.: U.S. Appl. No. 14/490,171, filed Sep. 18, 2014, attached.
International Search Report for corresponding PCT/US2015/060303, dated Mar. 14, 2016.

* cited by examiner

JOSEPHSON CURRENT SOURCE SYSTEMS AND METHOD

TECHNICAL FIELD

The present invention relates generally to quantum and classical digital superconducting circuits, and specifically to Josephson current source systems and method.

BACKGROUND

Superconducting digital technology has provided computing and/or communications resources that benefit from unprecedented high speed, low power dissipation, and low operating temperature. Superconducting digital technology has been developed as an alternative to CMOS technology, and typically comprises superconductor based single flux quantum superconducting circuitry, utilizing superconducting Josephson junctions, and can exhibit typical power dissipation of less than 1 nW (nanowatt) per active device at a typical data rate of 20 Gb/s (gigabits/second) or greater, and can operate at temperatures of around 4 Kelvin. Certain superconducting circuits in which Josephson junctions are the active devices can require a DC current bias of the Josephson junctions. Typical systems can provide the DC bias current directly using a bias resistor network, which can result in spurious magnetic fields and heat resulting from high power dissipation. The power budget in such circuits can be dominated by static power consumption, which can be dissipated in the bias resistor network whether or not the active device is switching.

SUMMARY

One embodiment describes a Josephson current source system. The system includes a flux-shuttle loop that includes a plurality of Josephson junctions spaced about the flux-shuttle loop and being configured, when activated, to sequentially trigger the plurality of Josephson junctions about the flux-shuttle loop, in response to an inductively-coupled AC input signal, to generate a DC output current provided through an output inductor. The system also includes a flux injector that is configured to selectively activate and deactivate the flux-shuttle loop to control an amplitude of the DC output current.

Another embodiment includes a method for controlling an amplitude of a DC output current. The method includes providing a first single-flux quantum (SFQ) pulse to a first flux injector to generate a first fluxon element that propagates around at least one flux-shuttle loop via sequential triggering of a plurality of Josephson junctions based on an AC input signal to increase the amplitude of the DC output current in an output inductor. The method also includes providing a first reciprocal SFQ pulse to the first flux injector to generate a first anti-fluxon element that substantially cancels the first fluxon element to maintain the amplitude of the DC output current. The method also includes providing a second SFQ pulse to a second flux injector to generate a second fluxon element that propagates around the at least one flux-shuttle loop via sequential triggering of the plurality of Josephson junctions based on the AC input signal to decrease the amplitude of the DC output current in the output inductor. The method further includes providing a second reciprocal SFQ pulse to the second flux injector to generate a second anti-fluxon element that substantially cancels the second fluxon element to maintain the amplitude of the DC output current.

Another embodiment describes a Josephson current source system. The system includes a flux-shuttle loop that includes a plurality of Josephson junctions spaced about the flux-shuttle loop and being configured, when activated, to sequentially trigger the plurality of Josephson junctions about the flux-shuttle loop in response to an inductively-coupled AC input signal to generate a DC output current provided through an output inductor. The system further includes a flux injector comprising a superconducting quantum interference device (SQUID) having one of a first flux state and a second flux state, the flux injector being configured to change from the first flux state to the second flux state in response to a single-flux quantum (SFQ) pulse to activate the flux-shuttle loop to increase an amplitude of the DC output current. The flux injector can be further configured to change from the second flux state to the first flux state in response to a reciprocal SFQ pulse to deactivate the flux-shuttle loop to maintain the amplitude of the DC output current.

DETAILED DESCRIPTION

Figure 1:
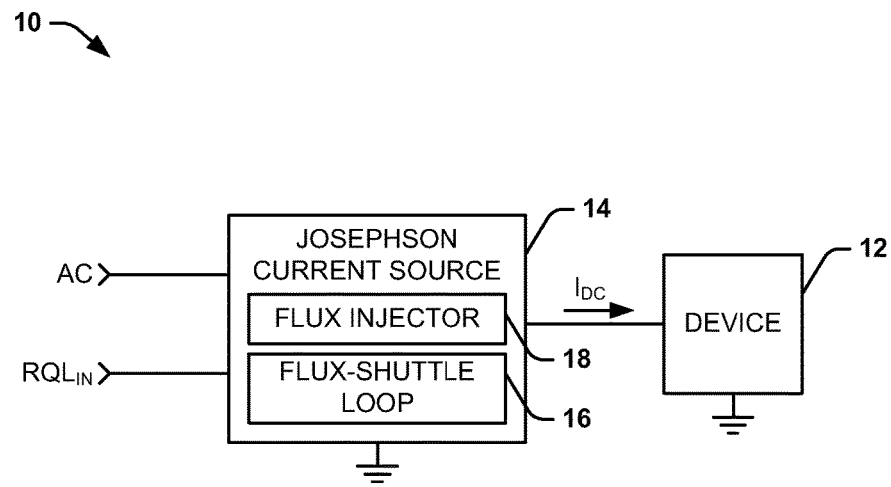
FIG. 1 illustrates an example of a superconducting circuit system.

The present invention relates generally to quantum and classical digital superconducting circuits, and specifically to Josephson current source systems and method. The Josephson current source includes a flux-shuttle loop comprising a plurality of stages. Each of the plurality of stages comprises a transformer, at least one Josephson junction, and a storage inductor. The transformer is configured to inductively couple an AC input signal to the flux-shuttle loop, such that the AC input signal provides a bias current in the flux-shuttle loop. The Josephson current source also includes a flux injector configured to selectively activate and deactivate the flux-shuttle loop. For example, the flux injector can be configured to receive a single-flux quantum (SFQ) pulse to activate the flux-shuttle loop and a reciprocal SFQ pulse to deactivate the flux-shuttle loop. Thus, when the flux-shuttle is activated, the Josephson junction(s) in each of the stages triggers to propagate a fluxon (e.g., an SFQ pulse) around the flux-shuttle loop based on the frequency of the AC input signal. As an example, the fluxon can propagate through a given stage at each positive and negative cycle of the AC input signal. The fluxon is provided to the storage inductor of each of the plurality of stages to provide a voltage pulse to an output inductor, such that the output inductor provides a rising DC output current ramp.

As an example, the AC input signal can include an in-phase AC input signal and a quadrature-phase AC input signal, and the flux-shuttle loop can include four stages. A primary winding of the transformers of two of the stages can have an opposite polarity relative to a primary winding of the transformers of the other two of the stages. Therefore, on a positive cycle of each of the in-phase AC input signal and the quadrature-phase AC input signal, the bias current induced in secondary windings of the transformers in two of the stages can be provided in a given direction around the flux-shuttle loop, and on a negative cycle of each of the in-phase AC input signal and the quadrature-phase AC input signal, the bias current induced in secondary windings of the transformers in the other two of the stages can be provided in the same given direction around the flux-shuttle loop. Therefore, the Josephson junction(s) in each of the stages can sequentially trigger at each 90° of the AC input signal to rotate the fluxon around the flux-shuttle loop to provide voltage pulses to the output inductor to generate the rising DC output current.

Based on the selective activation and deactivation of the flux-shuttle loop via the flux injector, the amplitude of the DC output current can be selectively controlled based on propagating fluxon elements around the flux-shuttle loop. As described herein, the term "fluxon element" refers to a fluxon or an anti-fluxon, and the term "anti-fluxon element" refers to the opposite of a respective fluxon element, and thus refers to an anti-fluxon or a fluxon, respectively. As an example, the DC output current can increase during propagation of a fluxon element (e.g., a fluxon) around at least one flux-shuttle loop, and the amplitude of the DC output current can be maintained (e.g., held at a constant amplitude in a zero load condition) in response to deactivation of the at least one flux-shuttle loop based on the reciprocal SFQ pulse received at the flux injector. The maintained amplitude of the DC output current can, for example, be less than a maximum compliance amplitude of the output inductor. Similarly, the DC output current can decrease during propagation of a fluxon element around at least one flux-shuttle loop, and the amplitude of the DC output current can be maintained (e.g., held at a constant amplitude in a zero load condition) in response to deactivation of the at least one flux-shuttle loop based on the reciprocal SFQ pulse received at the flux injector.

For example, two flux injectors can be implemented in a given DC output current source. The flux injectors can both be implemented in a single flux-shuttle loop or can be implemented in two respective flux-shuttle loops, to selectively increase and decrease the amplitude of the DC output current. For example, in a single flux-shuttle loop, a first flux injector can be configured to propagate a first fluxon element (e.g., a fluxon) around the flux-shuttle loop to increase the amplitude of the DC output current and to introduce an anti-fluxon element (e.g., an anti-fluxon) to cease the increase of the amplitude of the DC output current. Similarly, the second flux injector can be configured to propagate a second fluxon element (e.g., an anti-fluxon) around the flux-shuttle loop to decrease the amplitude of the DC output current and can introduce an anti-fluxon element (e.g., a fluxon) to cease the decrease of the amplitude of the DC output current. As another example, two flux-shuttle loops can be coupled to opposite ends of the output inductor, such that a first fluxon element (e.g., a fluxon) propagating around the first flux-shuttle loop can increase the amplitude of the DC output current and an anti-fluxon element (e.g., an anti-fluxon) introduced into the first flux-shuttle loop can cease the increase of the amplitude of the DC output current. Similarly, a second fluxon element (e.g., a fluxon) propagating around the second flux-shuttle loop can decrease the amplitude of the DC output current, and an anti-fluxon element (e.g., an anti-fluxon) introduced into the second flux-shuttle loop can cease the decrease of the amplitude of the DC output current.

FIG. 1 illustrates an example of a superconducting circuit system 10. As an example, the superconducting circuit system 10 can be implemented in any of a variety of classical and quantum computing applications, such as memory or processing systems. The superconducting circuit system 10 includes a device 12 that receives a DC output current, demonstrated in the example of FIG. 1 as a DC output current $I_{DC}$. As an example, the DC output current $I_{DC}$ can be provided as a power signal or as a driver signal to drive the device 12. For example, the device 12 can correspond to a memory driver, such as to provide a read current or a write current to a memory cell.

The superconducting circuit system 10 also includes a Josephson current source 14 that is configured to generate the DC output current $I_{DC}$ in response to a clock signal AC that can correspond to a clock signal associated with the Josephson current source 14. As an example, the clock signal AC can be a sinusoidal waveform having a substantially constant frequency (e.g., approximately 10 GHz) and a low AC current magnitude, such as applicable to reciprocal quantum logic (RQL) superconducting circuits (e.g., approximately 2 mA RMS). The Josephson current source 14 is demonstrated as receiving an input signal $RQL_{IN}$ that can be provided to the Josephson current source 14 to selectively activate and deactivate the operation of the Josephson current source 14 to generate the DC output current $I_{DC}$. For example, the input signal $RQL_{IN}$ can be provided via a reciprocal quantum logic (RQL) circuit. As an example, the input signal $RQL_{IN}$ can be one of a single-flux quantum (SFQ) pulse and a reciprocal SFQ pulse to control an amplitude of the DC output current.

In the example of FIG. 1, the Josephson current source 14 includes a flux-shuttle loop 16. The flux-shuttle loop 16 can include a plurality of stages that are configured to propagate a fluxon around the flux-shuttle loop 16 based on the frequency of the clock signal AC. As described herein, the term "loop" with respect to the flux-shuttle loop 16 describes a substantially continuous loop (e.g., circular) arrangement of the stages of the flux-shuttle loop 16, such that a first stage can be coupled to a last stage. Therefore, the fluxon can substantially continuously propagate around the flux-shuttle loop 16 in response to a first state of the input signal $RQL_{IN}$ (e.g., an SFQ pulse) and can similarly cease propagation around the flux-shuttle loop 16 in response to a second state of the input signal $RQL_{IN}$ (e.g., a reciprocal SFQ pulse). As an example, the second state of the input signal $RQL_{IN}$ can introduce an anti-fluxon into the flux-shuttle loop 16 (e.g., at half a clock cycle out-of-phase of the fluxon), such that the attractive force between the fluxon and the anti-fluxon can interact to substantially annihilate the fluxon. As a result, the amplitude of the DC output current $I_{DC}$ can be maintained at a specific amplitude (e.g., in a zero load condition associated with the device 12).

As an example, the flux-shuttle loop 16 can be arranged with or without shunt resistors. As an example, each of the stages of the flux-shuttle loop 16 can include a transformer, at least one Josephson junction, and a storage inductor. The transformer can be configured to inductively couple the clock signal AC to the flux-shuttle loop 16, such that the clock signal AC provides a bias current in the flux-shuttle loop 16. Thus, in response to the AC bias currents, the Josephson junction(s) in each of the stages of the flux-shuttle loop 16 triggers to propagate a fluxon around the flux-shuttle loop 16 based on the frequency of the clock signal AC. As an example, the fluxon can propagate through a given one of the stages at each positive and negative cycle of the clock signal AC. The fluxon, as it propagates around the flux-shuttle loop 16, can be provided to the storage inductor of each of the stages of the flux-shuttle loop 16 to provide a voltage pulse, such as to an output inductor in the Josephson current source 14 (not shown). Therefore, an increasing DC output current $I_{DC}$ can flow through the output inductor based on the voltage pulses being sequentially provided to the output inductor based on the frequency of the clock signal AC. For example, the voltage pulses can be generated based on the fluxons providing a small voltage (e.g., approximately 2 µV/GHz) to each of the storage inductors, such that the resulting voltage pulses can be integrated in the output inductor to provide the increasing DC output current $I_{DC}$.

In addition, the Josephson current source 14 includes a flux injector 18 that is configured to selectively activate and deactivate the flux-shuttle loop 16 in response to the input signal $RQL_{IN}$. As an example, the flux injector 18 can include a superconducting quantum interference device (SQUID) that is coupled to (e.g., part of) the flux-shuttle loop 16 and has a flux state corresponding to activation or deactivation of the flux-shuttle loop 16, and which can change state in response to the input signal $RQL_{IN}$. For example, in response to the input signal $RQL_{IN}$ being provided as an SFQ pulse, the flux state can reverse to introduce the fluxon into the flux-shuttle loop 16 to increase the amplitude of the DC output current $I_{DC}$. Similarly, in response to the input signal $RQL_{IN}$ being provided as a reciprocal SFQ pulse, the flux state can again reverse to introduce the anti-fluxon into the flux-shuttle loop 16 to maintain the amplitude of the DC output current $I_{DC}$ (e.g., at an amplitude that is less than a maximum compliance amplitude defined by the output inductor). Therefore, the flux injector 18 can be implemented to control the amplitude of the DC output current $I_{DC}$.

The Josephson current source 14 can therefore operate to generate the DC output current $I_{DC}$ in a power efficient manner. As an example, the Josephson current source 14 can generate substantially no heat from static power dissipation, as opposed to typical resistance-based DC current sources. Accordingly, the Josephson current source 14 can operate more efficiently and effectively than typical current sources, particularly in a quantum computing and energy-efficient high-performance computing environments. In addition, because the flux injector 18 can be configured to selectively activate and deactivate the flux-shuttle loop 16, the amplitude of the DC output current $I_{DC}$ can be selectively controlled. Therefore, the amplitude of the DC output current $I_{DC}$ can be maintained at an amplitude that is less than a maximum compliance limit defined by the associated output inductor, and thus the flux-shuttle loop 16 can be deactivated without maximizing the amplitude of the DC output current $I_{DC}$. Accordingly, as described in greater detail herein, the amplitude of the DC output current $I_{DC}$ can be incremented and decremented in a selective manner.

Figure 2:
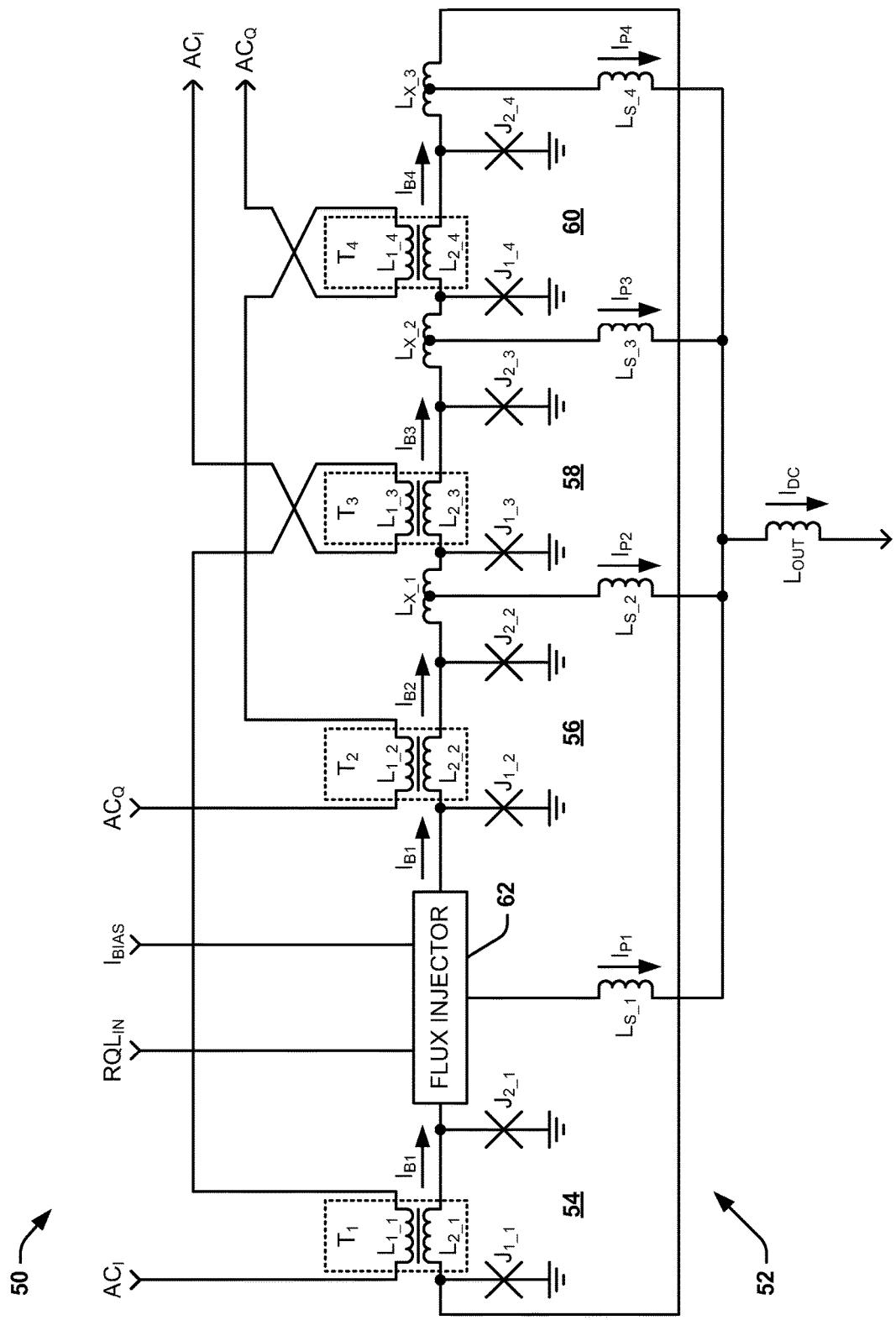
FIG. 2 illustrates an example of a Josephson current source circuit.

FIG. 2 illustrates an example of a Josephson current source circuit 50. The Josephson current source circuit 50 can correspond to Josephson current source 14 in the superconducting circuit system 10. Therefore, the Josephson current source circuit 50 includes a flux-shuttle loop 52 that includes a plurality of stages, demonstrated in the example of FIG. 2 as a first stage 54, a second stage 56, a third stage 58, and a fourth stage 60. The stages 54, 56, 58, and 60 are sequentially coupled to form a loop arrangement. The Josephson current source circuit 50 is configured to generate a DC output current based on an AC input signal. In the example of FIG. 2, the AC input signal is demonstrated as including an in-phase clock signal $AC_I$ and a quadrature-phase clock signal $AC_Q$. As an example, the in-phase clock signal $AC_I$ and the quadrature-phase clock signal $AC_Q$ can collectively correspond to AC quadrature signals that are implemented for RQL circuits. The DC output current is demonstrated as a current $I_{DC}$ that flows through an output inductor $L_{OUT}$.

Each of the stages 54, 56, 58, and 60 are configured substantially similarly with respect to each other. The first stage 54 includes a transformer $T_1$, a first Josephson junction $J_{1\_1}$, and a second Josephson junction $J_{2\_1}$. The second stage 56 includes a transformer $T_2$, a first Josephson junction $J_{1\_2}$, and a second Josephson junction $J_{2\_2}$. The third stage 58 includes a transformer $T_3$, a first Josephson junction $J_{1\_3}$, and a second Josephson junction $J_{2\_3}$. The fourth stage 60 includes a transformer $T_4$, a first Josephson junction $J_{1\_4}$, and a second Josephson junction $J_{2\_4}$. The first and second stages 54 and 56 are interconnected by a flux injector 62, the second and third stages 56 and 58 are interconnected by an inductor $L_{X\_1}$, the third and fourth stages 58 and 60 are interconnected by an inductor $L_{X\_2}$, and the fourth and first stages 60 and 54 are interconnected by an inductor $L_{X\_3}$.

The transformers $T_1$ and $T_3$ include a primary winding $L_{1\_1}$ and $L_{1\_3}$, respectively, through which the in-phase clock signal $AC_I$ flows, and the transformers $T_2$ and $T_4$ include a primary winding $L_{1\_2}$ and $L_{1\_4}$, respectively, through which the quadrature-phase clock signal $AC_Q$ flows. The transformers $T_1$ and $T_3$ provide inductive coupling of the in-phase clock signal $AC_I$ to the flux-shuttle loop 52, and the transformers $T_2$ and $T_4$ provide inductive coupling of the quadrature-phase clock signal $AC_Q$ to the flux-shuttle loop 52. Therefore, the first transformer $T_1$ can generate a bias current $I_{B1}$ via a secondary winding $L_{2\_1}$ and the third transformer $T_3$ can generate a bias current $I_{B3}$ via a secondary winding $L_{2\_3}$ in response to the in-phase clock signal $AC_I$. Similarly, the second transformer $T_2$ can generate a bias current $I_{B2}$ via a secondary winding $L_{2\_2}$ and the fourth transformer $T_4$ can generate a bias current $I_{B4}$ via a secondary winding $L_{2\_4}$ in response to the quadrature-phase clock signal $AC_Q$. As an example, the inductance of the inductors $L_{X\_1}, L_{X\_2}, L_{X\_3}$, and the inductors of the flux injector 62 (as described in greater detail herein), as well as the secondary windings L2_1, L2_2, L2_3, and L2_4, can be selected to have a loop inductance so that a ratio of the Josephson inductance of the Josephson junctions $J_{1\_1}, J_{2\_1}, J_{1\_2}, J_{2\_2}, J_{1\_3}, J_{2\_3}, J_{1\_4}$, and $J_{2\_4}$ to that of the loop inductance is greater than one to provide operation of the flux-shuttle loop 52 in the long junction regime. Therefore, the Josephson junctions $J_{1\_1}, J_{2\_1}, J_{1\_2}, J_{2\_2}, J_{1\_3}, J_{2\_3}, J_{1\_4}$, and $J_{2\_4}$, can be damped even in the absence of shunt resistors. Alternatively, the Josephson junctions $J_{1\_1}, J_{2\_1}, J_{1\_2}, J_{2\_2}, J_{1\_3}, J_{2\_3}, J_{1\_4}$, and $J_{2\_4}$, can include shunt resistors.

As an example, each of the first in-phase clock signal $AC_I$ and the quadrature-phase clock signal $AC_Q$ can include a positive portion (e.g., in a first half of a respective period) and a negative portion (e.g., in a second half of a respective period). As demonstrated in the example of FIG. 2, the primary winding $L_{1\_3}$ of the third transformer $T_3$ has a polarity that is opposite the polarity of the primary winding $L_{1\_1}$ of the first transformer $T_1$. Similarly, the primary winding $L_{1\_4}$ of the fourth transformer $T_4$ has a polarity that is opposite the polarity of the primary winding $L_{1\_2}$ of the second transformer $T_2$. Therefore, the bias current $I_{B1}$ is induced in a first direction via the second winding $L_{2\_1}$ of the first transformer $T_1$ during the negative portion of the in-phase clock signal $AC_I$. However, because the primary windings $L_{1\_1}$ and $L_{1\_3}$ of the first and third transformers $T_1$ and $T_3$, respectively, have opposite polarities, the bias current $I_{B3}$ is also induced in the first direction via the second winding $L_{2\_3}$ of the third transformer $T_3$ during the positive portion of the in-phase clock signal $AC_I$. Similarly, the bias current $I_{B2}$ is induced in the first direction during the negative portion of the quadrature-phase clock signal $AC_Q$, and the bias current $I_{B4}$ is also induced in the first direction during the positive portion of the quadrature-phase clock signal $AC_Q$. Therefore, as described in greater detail in the example of FIG. 4, the bias currents $I_{B1}$, $I_{B2}$, $I_{B3}$, and $I_{B4}$ are sequentially provided in each of 90° intervals of the AC input signals $AC_I$ and $AC_Q$. In the example of FIG. 2, the "first direction" is demonstrated as left-to-right from the respective secondary windings $L_{2\_1}$, $L_{2\_2}$, $L_{2\_3}$, and $L_{2\_4}$.

The flux injector 62 is demonstrated as receiving a bias current $I_{BIAS}$ and an input signal $RQL_{IN}$ that can be provided to the Josephson current source circuit 50 (e.g., from an RQL circuit) to activate the flux-shuttle loop 52, and thus initialize the operation of the Josephson current source circuit 50. As an example, the input signal $RQL_{IN}$ can be an SFQ pulse or a reciprocal SFQ pulse that can activate and deactivate the flux-shuttle loop 52, respectively. As an example, the flux injector 62 can include a SQUID that interconnects the transformers $T_1$ and $T_2$ and has a flux state corresponding to activation or deactivation of the flux-shuttle loop 52, and which can change state in response to the input signal $RQL_{IN}$. For example, in response to the input signal $RQL_{IN}$ being provided as the SFQ pulse, the flux state can reverse to introduce a fluxon into the flux-shuttle loop 52 in the direction of the flow of the currents $I_{B1}$, $I_{B2}$, $I_{B3}$, and $I_{B4}$ to activate the flux-shuttle loop 52, and thus to sequentially trigger the Josephson junctions $J_{1\_1}$, $J_{2\_1}$, $J_{1\_2}$, $J_{2\_2}$, $J_{1\_3}$, $J_{2\_3}$, $J_{1\_4}$, and $J_{2\_4}$. Similarly, in response to the input signal $RQL_{IN}$ being provided as a reciprocal SFQ pulse, the flux state can again reverse to introduce the anti-fluxon into the flux-shuttle loop 52 (e.g., at half a clock cycle out-of-phase of the fluxon) in the same direction as the fluxon. Therefore, an attractive force between the fluxon and the anti-fluxon can draw the fluxon and anti-fluxon together to annihilate the fluxon, thus deactivating the flux-shuttle loop 52.

The addition of the fluxon and the bias current $I_{B2}$ can be sufficient to exceed a critical current of the Josephson junction $J_{1\_2}$. For example, during a negative portion of the quadrature-phase clock signal $AC_Q$, the bias current $I_{B2}$ and the fluxon resulting from triggering of the Josephson junction $J_{1\_2}$ can combine to flow through the Josephson junction $J_{2\_2}$. In response, because the magnitude of the bias current $I_{B2}$ and the fluxon exceed the critical current of the Josephson junction $J_{2\_2}$, the Josephson junction $J_{2\_2}$ triggers to propagate the fluxon from the second stage 56 to the third stage 58 through the inductor $L_{X\_1}$ to trigger the first Josephson junction $J_{1\_3}$. During the positive portion of the in-phase clock signal $AC_I$, the fluxon can combine with the bias current $I_{B3}$ to trigger the Josephson junction $J_{2\_3}$. As a result, the Josephson junction $J_{2\_3}$ propagates the fluxon to the fourth stage 60. The Josephson junctions $J_1$ and $J_2$ in each of the stages 54, 56, 58, and 60 can thus continue to sequentially trigger based on the frequency of the in-phase clock signal $AC_I$ and the quadrature-phase clock signal $AC_Q$. Accordingly, the fluxon is sequentially propagated through each of the stages 54, 56, 58, and 60 at each 90° interval of the AC input signals $AC_I$ and $AC_Q$.

In response to the fluxon sequentially propagated through the Josephson junction $J_2$ in each of the stages 54, 56, 58, and 60, a voltage pulse is generated that increments the current in a storage inductor interconnecting the stages 54, 56, 58, and 60. In the example of FIG. 2, a storage inductor $L_{S\_1}$ (associated with the flux injector 62) interconnects the first and second stages 54 and 56, a storage inductor $L_{S\_2}$ (associated with the inductor $L_{X\_1}$) interconnects the second and third stages 56 and 58, a storage inductor $L_{S\_3}$ (associated with the inductor $L_{X\_2}$) interconnects the third and fourth stages 58 and 60, and a storage inductor $L_{S\_4}$ (associated with the inductor $L_{X\_3}$) interconnects the fourth and first stages 60 and 54. Thus, in response to the Josephson junction $J_{2\_1}$ triggering, the fluxon generates a resulting current increment $I_{P1}$ in the storage inductor $L_{S\_1}$. In response to the Josephson junction $J_{2\_2}$ triggering, the fluxon generates a resulting current increment $I_{P2}$ in the storage inductor $L_{S\_2}$. In response to the Josephson junction $J_{2\_3}$ triggering, the fluxon generates a resulting current increment $I_{P3}$ in the storage inductor $L_{S\_3}$. In response to the Josephson junction $J_{2\_4}$ triggering, the fluxon generates a resulting current increment $I_{P4}$ in the storage inductor $L_{S\_4}$. Each of the storage inductors $L_{S\_1}$, $L_{S\_2}$, $L_{S\_3}$, and $L_{S\_4}$ are coupled to the output inductor $L_{OUT}$. As a result, the output inductor $L_{OUT}$ integrates each of the current increments $I_{P1}$, $I_{P2}$, $I_{P3}$, and $I_{P4}$ to provide an increasing amplitude of the DC output current $I_{DC}$. As a result, the DC output current $I_{DC}$ can be provided to a device (e.g., the device 12 in the example of FIG. 1) based on the in-phase clock signal $AC_I$ and the quadrature-phase clock signal $AC_Q$, and the number of times the fluxon has propagated around the flux-shuttle loop 52 before the flux-shuttle loop 52 is deactivated.

Figure 3:
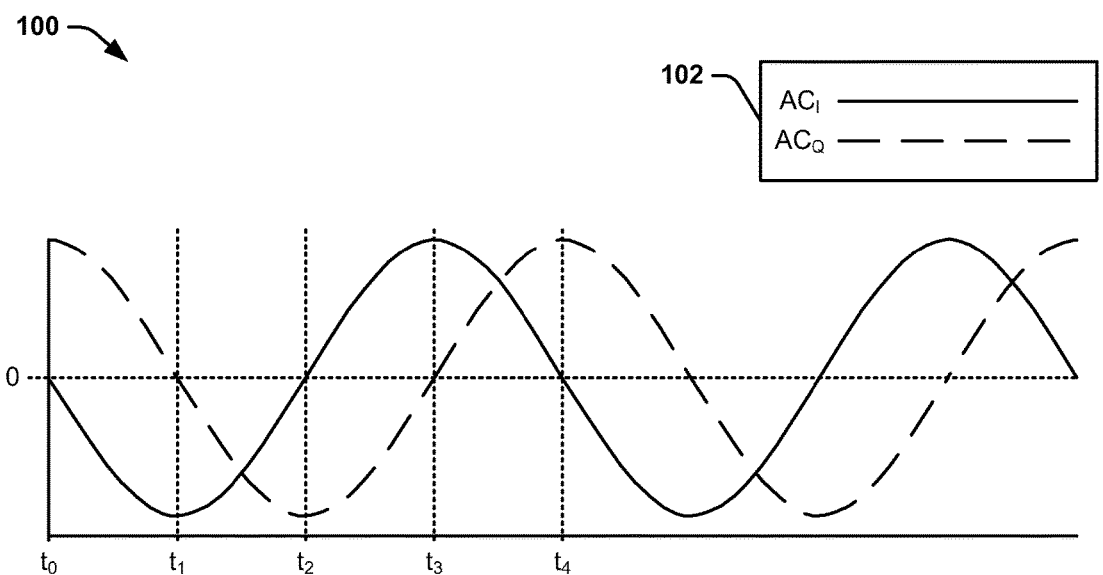
FIG. 3 illustrates an example of a timing diagram.

FIG. 3 illustrates an example of a timing diagram 100. The timing diagram 100 includes the in-phase clock signal $AC_I$ and the quadrature-phase clock signal $AC_Q$, as indicated at the legend 102, as a function of time. The in-phase clock signal $AC_I$ and the quadrature-phase clock signal $AC_Q$ are each demonstrated as sinusoidal signals having magnitudes centered about zero. The in-phase clock signal $AC_I$ and the quadrature-phase clock signal $AC_Q$ in the example of FIG. 3 can correspond to the in-phase clock signal $AC_I$ and the quadrature-phase clock signal $AC_Q$ in the example of FIG. 2. Therefore, reference is to be made to the example of FIG. 2 in the following description of the example of FIG. 3.

The flux-shuttle loop 52 can be activated via the flux injector 62, as described in greater detail herein. Upon activation, at a time $t_0$, a negative portion of the in-phase clock signal $AC_I$ begins, with a positive peak of the in-phase clock signal $AC_I$ occurring at a time $t_1$. Therefore, the in-phase clock signal $AC_I$ begins to induce the bias current $I_{B1}$ via the secondary winding $L_{2\_1}$ in the first direction based on the inductive coupling with the primary winding $L_{1\_1}$. At a time just subsequent to the time $t_1$ (e.g., based on the inductance of the transformer $T_1$), the magnitude of the bias current $I_{B1}$, combined with the fluxon provided by the Josephson junction $J_{1\_1}$, exceeds the critical current of the Josephson junction $J_{2\_1}$ having previously triggered, and therefore becomes sufficient to trigger the Josephson junction $J_{2\_1}$. As a result, the Josephson junction $J_{2\_1}$ propagates the fluxon, which generates the current increment $I_{P1}$ in the storage inductor $L_{S\_1}$ via the flux injector 62, as described in greater detail herein, that is integrated by the output inductor $L_{OUT}$ to increase the amplitude of the DC output current $I_{DC}$. The fluxon then propagates to the second stage to trigger the Josephson junction $J_{1\_2}$.

Also, at the time $t_1$, a negative portion of the quadrature-phase clock signal $AC_Q$ begins, with a positive peak of the quadrature-phase clock signal $AC_Q$ occurring at a time $t_2$. Therefore, the quadrature-phase clock signal $AC_Q$ begins to induce the bias current $I_{B2}$ via the secondary winding $L_{2\_2}$ in the first direction based on the inductive coupling with the primary winding $L_{1\_2}$. At a time just subsequent to the time $t_2$ (e.g., based on the inductance of the transformer $T_2$), the magnitude of the bias current $I_{B2}$, combined with the fluxon provided by the Josephson junction $J_{1\_2}$ exceeds the critical current of the Josephson junction $J_{2\_2}$, and therefore becomes sufficient to trigger the Josephson junction $J_{2\_2}$. As a result, the Josephson junction $J_{2\_2}$ propagates the fluxon, which generates the current increment $I_{P2}$ in the storage inductor $L_{S\_2}$ that is integrated by the output inductor $L_{OUT}$ to increase the amplitude of the DC output current $I_{DC}$ and propagates to the third stage to trigger the Josephson junction $J_{1\_3}$.

Also, at the time $t_2$, a positive portion of the in-phase clock signal $AC_I$ begins, with a negative peak of the in-phase clock signal $AC_I$ occurring at a time $t_3$. Therefore, the in-phase clock signal $AC_I$ begins to induce the bias current $I_{B3}$ via the secondary winding $L_{2\_3}$ in the first direction based on the inductive coupling with the primary winding $L_{1\_3}$ (e.g., opposite the polarity of the primary winding $L_{1\_1}$). At a time just subsequent to the time $t_3$ (e.g., based on the inductance of the transformer $T_3$), the magnitude of the bias current $I_{B3}$, combined with the fluxon propagated by the Josephson junction $J_{1\_3}$, exceeds the critical current of the Josephson junction $J_{2\_3}$, and therefore becomes sufficient to trigger the Josephson junction $J_{2\_3}$. As a result, the Josephson junction $J_{2\_3}$ propagates the fluxon, which generates the current increment $I_{P3}$ in the storage inductor $L_{S\_3}$ that is integrated by the output inductor $L_{OUT}$ to increase the amplitude of the DC output current $I_{DC}$ and propagates to the fourth stage to trigger the Josephson junction $J_{1\_4}$.

Also, at the time $t_3$, a positive portion of the quadrature-phase clock signal $AC_Q$ begins, with a negative peak of the quadrature-phase clock signal $AC_Q$ occurring at a time $t_4$. Therefore, the quadrature-phase clock signal $AC_Q$ begins to induce the bias current $I_{B4}$ via the secondary winding $L_{2\_4}$ in the first direction based on the inductive coupling with the primary winding $L_{1\_4}$ (e.g., opposite the polarity of the primary winding $L_{1\_2}$). At a time just subsequent to the time $t_4$ (e.g., based on the inductance of the transformer $T_4$), the magnitude of the bias current $I_{B4}$, combined with the fluxon propagated by the Josephson junction $J_{1\_4}$, exceeds the critical current of the Josephson junction $J_{2\_4}$, and therefore becomes sufficient to trigger the Josephson junction $J_{2\_4}$. As a result, the Josephson junction $J_{2\_4}$ propagates the fluxon, which generates the current increment $I_N$ in the storage inductor $L_{S\_4}$ that is integrated by the output inductor $L_{OUT}$ to increase the amplitude of the DC output current $I_{DC}$ and propagates to the first stage to trigger the Josephson junction $J_{1\_1}$.

Also, at the time $t_4$, a negative portion of the in-phase clock signal $AC_I$ begins. Therefore, the process of converting the in-phase clock signal $AC_I$ and the quadrature-phase clock signal $AC_Q$ repeats, such that the time $t_4$ is equivalent to the time $t_0$, as described previously. Accordingly, the Josephson junctions $J_{1\_1}$, $J_{2\_1}$, $J_{1\_2}$, $J_{2\_2}$, $J_{1\_3}$, $J_{2\_3}$, $J_{1\_4}$, and $J_{2\_4}$ can sequentially trigger when the flux-shuttle loop 52 is activated via the flux injector 62 to propagate the fluxon around the flux-shuttle loop 52 to continuously provide the current increments $I_{P1}$, $I_{P2}$, $I_{P3}$, and $I_{P4}$ in response to the triggering of the $J_{2\_1}$, $J_{2\_2}$, $J_{2\_3}$, and $J_{2\_4}$, respectively, to the output inductor $L_{OUT}$ based on the frequency of the in-phase clock signal $AC_I$ and the quadrature-phase clock signal $AC_Q$. As a result, the output inductor $L_{OUT}$ can integrate the current increments $I_{P1}$, $I_{P2}$, $I_{P3}$, and $I_{P4}$ to increase the amplitude of the DC output current $I_{DC}$.

Figure 4:
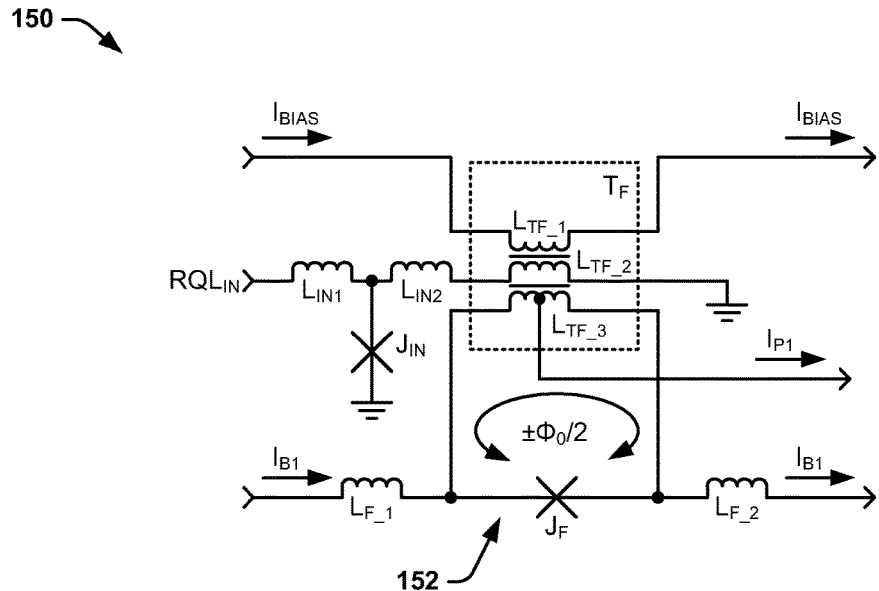
FIG. 4 illustrates an example of a flux injector.

FIG. 4 illustrates an example of a flux injector 150. The flux injector 150 is configured to generate a fluxon and an anti-fluxon in response to the input signal $RQL_{IN}$ to activate and deactivate, respectively, an associated flux-shuttle loop. The flux injector 150 can correspond to the flux injector 18 in the example of FIG. 1 and/or the flux injector 62 in the example of FIG. 2. Therefore, reference is to be made to the example of FIGS. 1-3 in the following description of the example of FIG. 4.

The flux injector 150 receives the bias current $I_{BIAS}$ and the input signal $RQL_{IN}$, which can correspond to one of an SFQ pulse and a reciprocal SFQ pulse. The bias current $I_{BIAS}$ is provided through an inductor $L_{TF\_1}$ that can correspond to a primary winding of a transformer $T_F$. The inductor $L_{TF\_1}$ can be magnetically coupled to an inductor $L_{TF\_2}$ and an inductor $L_{TF\_3}$ corresponding to respective secondary windings of the transformer $T_F$. Therefore, the bias current $I_{BIAS}$ is induced to flow through the inductors $L_{TF\_2}$ and $L_{TF\_3}$. The flux injector 150 includes a SQUID 152 that includes the inductor $L_{TF\_3}$ and a Josephson junction $J_F$. The flux injector 150 also includes an inductor $L_{F\_1}$ and $L_{F\_2}$ arranged on opposite sides of the SQUID 152 and through which the current $I_{B1}$ flows. Therefore, the SQUID 152 is coupled to and forms a portion of the flux-shuttle loop 52 (e.g., between the transformers $T_1$ and $T_2$, as well as the Josephson junctions $J_{2\_1}$ and $J_{1\_2}$). As described herein, the SQUID 152 has a flux state $\pm\Phi_0/2$ corresponding to a flux direction (e.g., clockwise or counterclockwise) of a flux $\Phi_0/2$. Thus, the SQUID 152 has a first flux state $+\Phi_0/2$ and a second flux state $-\Phi_0/2$ that correspond to respective opposite flux directions of the flux $\Phi_0/2$. The flux state of the SQUID 152 corresponds to activation and deactivation of the flux-shuttle loop 52.

The input signal $RQL_{IN}$ is provided through a first input inductor $L_{IN1}$ to a second input inductor $L_{IN2}$ that is coupled to the inductor $L_{TF\_2}$ of the transformer $T_F$. In the example of FIG. 4, the first and second input inductors $L_{IN1}$ and $L_{IN2}$ being separated by an input Josephson junction $J_{IN}$. As an example, the SQUID 152 can have an initial flux state of $+\Phi_0/2$ corresponding to a deactivated state of the flux-shuttle loop 52. Thus, in response to the input signal $RQL_{IN}$ being provided as an SFQ pulse, the SFQ pulse is provided through the first input inductor $L_{IN1}$ to trigger the input Josephson junction $J_{IN}$ to set a superconducting phase of the Josephson junction $J_{IN}$ to a first superconducting phase. The input Josephson junction $J_{IN}$ then propagates the SFQ pulse through the second input inductor $L_{IN2}$ and through the inductor $L_{TF\_2}$. The SFQ pulse is thus induced into the inductor $L_{TF\_3}$, and in combination with the bias current $I_{BIAS}$ that is likewise induced into the inductor $L_{TF\_3}$, triggers the Josephson junction $J_F$. As a result, the flux state of the SQUID 152 switches from $+\Phi_0/2$ to $-\Phi_0/2$, and a fluxon (e.g., SFQ pulse) is emitted from the Josephson junction $J_F$ to propagate through the inductor $L_{F\_2}$ and around the flux-shuttle loop 52, as described previously in the example of FIG. 3. Therefore, the input signal $RQL_{IN}$ provided as an SFQ pulse can activate the flux-shuttle loop 52 to increase the amplitude of the DC output current $I_{DC}$ in the output inductor $L_{OUT}$.

The input signal $RQL_{IN}$ can also be provided as a reciprocal SFQ pulse to deactivate the flux-shuttle loop 52. As an example, in response to the input signal $RQL_{IN}$ being provided as a reciprocal SFQ pulse (e.g., at half a clock cycle out-of-phase of the fluxon propagating around the flux-shuttle loop 52), the reciprocal SFQ pulse is provided through the first input inductor $L_{IN1}$ to "untrigger" the input Josephson junction $J_{IN}$, and thus set the superconducting phase of the Josephson junction $J_{IN}$ to a second superconducting phase (e.g., an initial superconducting phase). The input Josephson junction $J_{IN}$ then propagates the reciprocal SFQ pulse through the second input inductor $L_{IN2}$ and through the inductor $L_{TF\_2}$. The reciprocal SFQ pulse is thus induced into the inductor $L_{TF\_3}$, and in combination with the bias current $I_{BIAS}$ that is likewise induced into the inductor $L_{TF\_3}$, "untriggers" the Josephson junction $J_F$, similar to as described regarding the input Josephson junction $J_{IN}$. As a result, the flux state of the SQUID 152 switches from $-\Phi_0/2$ to $+\Phi_0/2$, and an anti-fluxon (e.g., a reciprocal SFQ pulse) is emitted from the Josephson junction $J_F$ to propagate through the inductor $L_{F\_2}$ and around the flux-shuttle loop 52, similar to as described previously regarding the fluxon. The attractive force between the fluxon and the anti-fluxon that now both exist in the flux-shuttle loop 52 can be sufficient to overcome a driving force provided by the AC signals $AC_I$ and $AC_Q$, thus resulting in combination of the fluxon and anti-fluxon to annihilate the fluxon substantially instantaneously. Therefore, the current increments $I_{P1}$, $I_{P2}$, $I_{P3}$, and $I_{P4}$ cease to be provided through the respective storage inductors $L_{S\_1}$, $L_{S\_2}$, $L_{S\_3}$, and $L_{S\_4}$, and thus the amplitude of the DC output current $I_{DC}$ is maintained at a current amplitude (e.g., absent a load of the device 12). Accordingly, the input signal $RQL_{IN}$ provided as a reciprocal SFQ pulse can deactivate the flux-shuttle loop 52 to maintain the amplitude of the DC output current $I_{DC}$ in the output inductor $L_{OUT}$.

Figure 5:
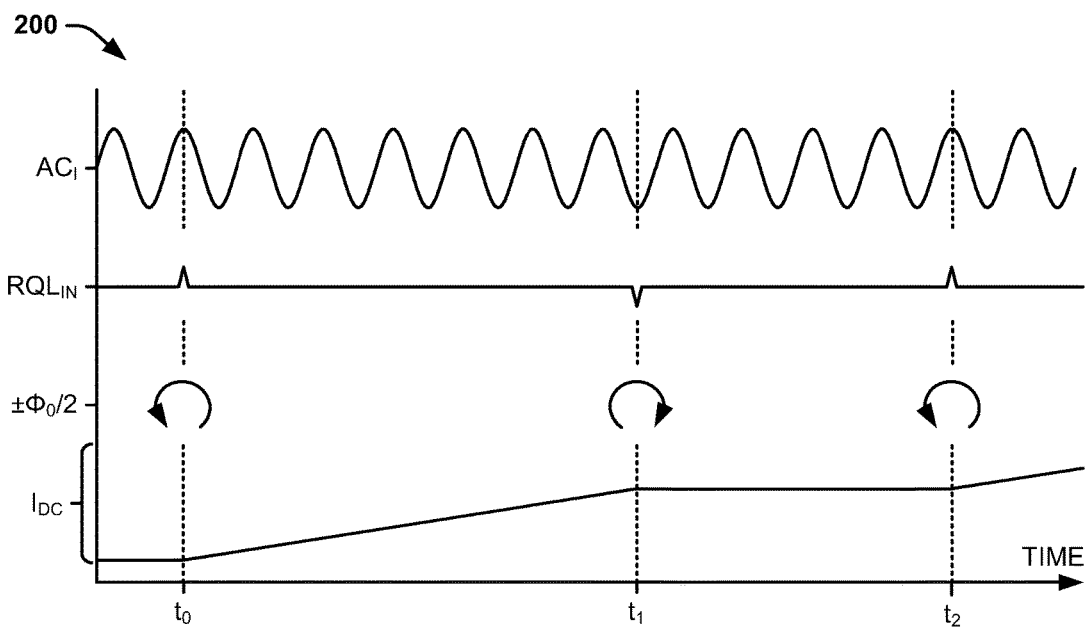
FIG. 5 illustrates another example of a timing diagram.

FIG. 5 illustrates another example of a timing diagram 200. The timing diagram 200 demonstrates the in-phase clock signal $AC_I$, the input signal $RQL_{IN}$, the flux state $\pm\Phi_0/2$ of the SQUID 152, and the DC output current $I_{DC}$ demonstrated as having a varying amplitude, that are all plotted as a function of time. In the following description of the example of FIG. 5, reference is to be made to the examples of FIGS. 1-4.

In the example of FIG. 5, the SQUID 152 has an initial flux state of $+\Phi_0/2$ (not shown) that corresponds to deactivation of the flux-shuttle loop 52. Therefore, the DC output current $I_{DC}$ is maintained at a substantially constant amplitude (e.g., absent a load condition of the device 12). At a time $t_0$, demonstrated as occurring at a peak of the in-phase clock signal $AC_I$, the input signal $RQL_{IN}$ is provided as an SFQ pulse. While the time $t_0$ is demonstrated at a peak of the in-phase clock signal $AC_I$, it is to be understood that the time $t_0$ can occur at any other part of the period of the in-phase clock signal $AC_I$ (e.g., at a zero-crossing). In response, the SFQ pulse triggers the input Josephson junction $J_{IN}$ to propagate the SFQ pulse through the second input inductor $L_{IN2}$ and through the inductor $L_{TF\_2}$. As a result, the Josephson junction $J_F$ triggers to switch the flux state of the SQUID 152 switch from $+\Phi_0/2$ to $-\Phi_0/2$, demonstrated diagrammatically at the time $t_0$. Therefore, a fluxon (e.g., SFQ pulse) is emitted from the Josephson junction $J_F$ to propagate through the inductor $L_{F\_2}$ and around the flux-shuttle loop 52, as described previously in the example of FIG. 3. Accordingly, beginning at the time $t_0$, the flux-shuttle loop 52 is activated to increase the amplitude of the DC output current $I_{DC}$ in the output inductor $L_{OUT}$ based on the current increments $I_{P1}$, $I_{P2}$, $I_{P3}$, and $I_{P4}$ being sequentially provided through the respective storage inductors $L_{S\_1}$, $L_{S\_2}$, $L_{S\_3}$, and $L_{S\_4}$ in response to the sequential triggering of the Josephson junctions $J_{1\_1}$, $J_{2\_1}$, $J_{1\_2}$, $J_{2\_2}$, $J_{1\_3}$, $J_{2\_3}$, $J_{1\_4}$, and $J_{2\_4}$.

At a time $t_1$, the input signal $RQL_{IN}$ is provided as a reciprocal SFQ pulse. As an example, and as described in greater detail herein, a counter (not shown) can be configured to count a number of periods of the in-phase clock signal $AC_I$ to increase the DC output current $I_{DC}$ by a predetermined amplitude based on the predetermined number of current increments $I_{P1}$, $I_{P2}$, $I_{P3}$, and $I_{P4}$. In response, the reciprocal SFQ pulse triggers the input Josephson junction $J_{IN}$ to propagate the reciprocal SFQ pulse through the second input inductor $L_{IN2}$ and through the inductor $L_{TF\_2}$. As a result, the Josephson junction $J_F$ untriggers to switch the flux state of the SQUID 152 switch from $-\Phi_0/2$ to $+\Phi_0/2$, demonstrated diagrammatically at the time $t_1$. Therefore, an anti-fluxon (e.g., a reciprocal SFQ pulse) is emitted from the Josephson junction $J_F$ to propagate through the inductor $L_{F\_2}$ and around the flux-shuttle loop 52, as described previously in the example of FIG. 3. The input signal $RQL_{IN}$ is demonstrated in the example of FIG. 5 as providing the reciprocal SFQ pulse, and thus introducing the anti-fluxon, at a trough of the in-phase clock signal $AC_I$, thus a half of a clock-cycle out-of-phase with respect to the fluxon. The attractive force between the fluxon and the anti-fluxon results in a substantially instantaneous combination of the fluxon and anti-fluxon to annihilate the fluxon. Therefore, beginning at the time $t_1$, the flux-shuttle loop 52 is deactivated to cease the current increments $I_{P1}$, $I_{P2}$, $I_{P3}$, and $I_{P4}$, and thus to maintain the constant amplitude of the DC output current $I_{DC}$ (e.g., absent a load of the device 12).

At a time $t_2$, demonstrated again as occurring at a peak of the in-phase clock signal $AC_I$ (e.g., consistent with the time $t_0$), the input signal $RQL_{IN}$ is provided as an SFQ pulse. In response, the SFQ pulse triggers the input Josephson junction $J_{IN}$ to propagate the SFQ pulse through the second input inductor $L_{IN2}$ and through the inductor $L_{TF\_2}$. As a result, the Josephson junction $J_F$ triggers to switch the flux state of the SQUID 152 switch from $+\Phi_0/2$ to $-\Phi_0/2$. Therefore, a fluxon is emitted from the Josephson junction $J_F$ to propagate through the inductor $L_{F\_2}$ and around the flux-shuttle loop 52, as described previously in the example of FIG. 3. Accordingly, beginning at the time $t_2$, the flux-shuttle loop 52 is activated to once again increase the amplitude of the DC output current $I_{DC}$ in the output inductor $L_{OUT}$ based on the current pulses $I_{P1}$, $I_{P2}$, $I_{P3}$, and $I_{P4}$ being sequentially provided through the respective storage inductors $L_{S\_1}$, $L_{S\_2}$, $L_{S\_3}$, and $L_{S\_4}$ in response to the sequential triggering of the Josephson junctions $J_{1\_1}$, $J_{2\_1}$, $J_{1\_2}$, $J_{2\_2}$, $J_{1\_3}$, $J_{2\_3}$, $J_{1\_4}$, and $J_{2\_4}$. As an example, the flux-shuttle loop 52 can be periodically activated to restore the amplitude of the DC output current $I_{DC}$, such as in response to consumption of the DC output current $I_{DC}$ by the device 12.

It is to be understood that the Josephson current source circuit 50 is not intended to be limited to the example of FIG. 2, the flux injector 150 is not intended to be limited to the example of FIG. 4, and the operation of the Josephson current source circuit 50 is not intended to be limited to the examples of FIGS. 3 and 5. As an example, the AC input signal is not limited to being implemented as the in-phase clock signal $AC_I$ and the quadrature-phase clock signal $AC_Q$, but could instead be a single sinusoidal signal. As another example, the flux-shuttle loop 52 could include more or less than the four stages 54, 56, 58, and 60, such as any multiple of two stages to accommodate positive and negative portions of the AC input signal. Additionally, while the example of FIG. 2 demonstrates the in-phase and quadrature-phase AC input signals $AC_I$ and $AC_Q$ provided in opposite respective polarities to sequentially provide the bias currents $I_{B1}$, $I_{B2}$, $I_{B3}$, and $I_{B4}$ at each of 90° intervals, other arrangements of AC input signals can be implemented to provide the bias currents $I_{B1}$, $I_{B2}$, $I_{B3}$, and $I_{B4}$ at each of 90° intervals. For example, the Josephson current source circuit 50 can implement four separate AC input signals that are each 90° out of phase of each other, with the transformers $T_1$ through $T_4$ all having the same polarity. Furthermore, other types of AC signals can be implemented for providing the DC output current $I_{DC}$, such as square wave signals and/or signals having separate frequencies with respect to each other. As yet another example, the stages 54, 56, 58, and 60 are not limited to the arrangement provided in the example of FIG. 2, but could instead have a different physical arrangement with respect to the Josephson junctions $J_1$ and $J_2$, inductors Lx, transformers $T_1$ through $T_4$, and/or storage inductors $L_S$. Furthermore, the flux injector 150 can be configured in a variety of different ways to inject the fluxon and anti-fluxon into the flux-shuttle loop 52 to selectively activate and deactivate the flux-shuttle loop 52, respectively. Accordingly, the Josephson current source circuit 50 can be configured in a variety of ways.

Figure 6:
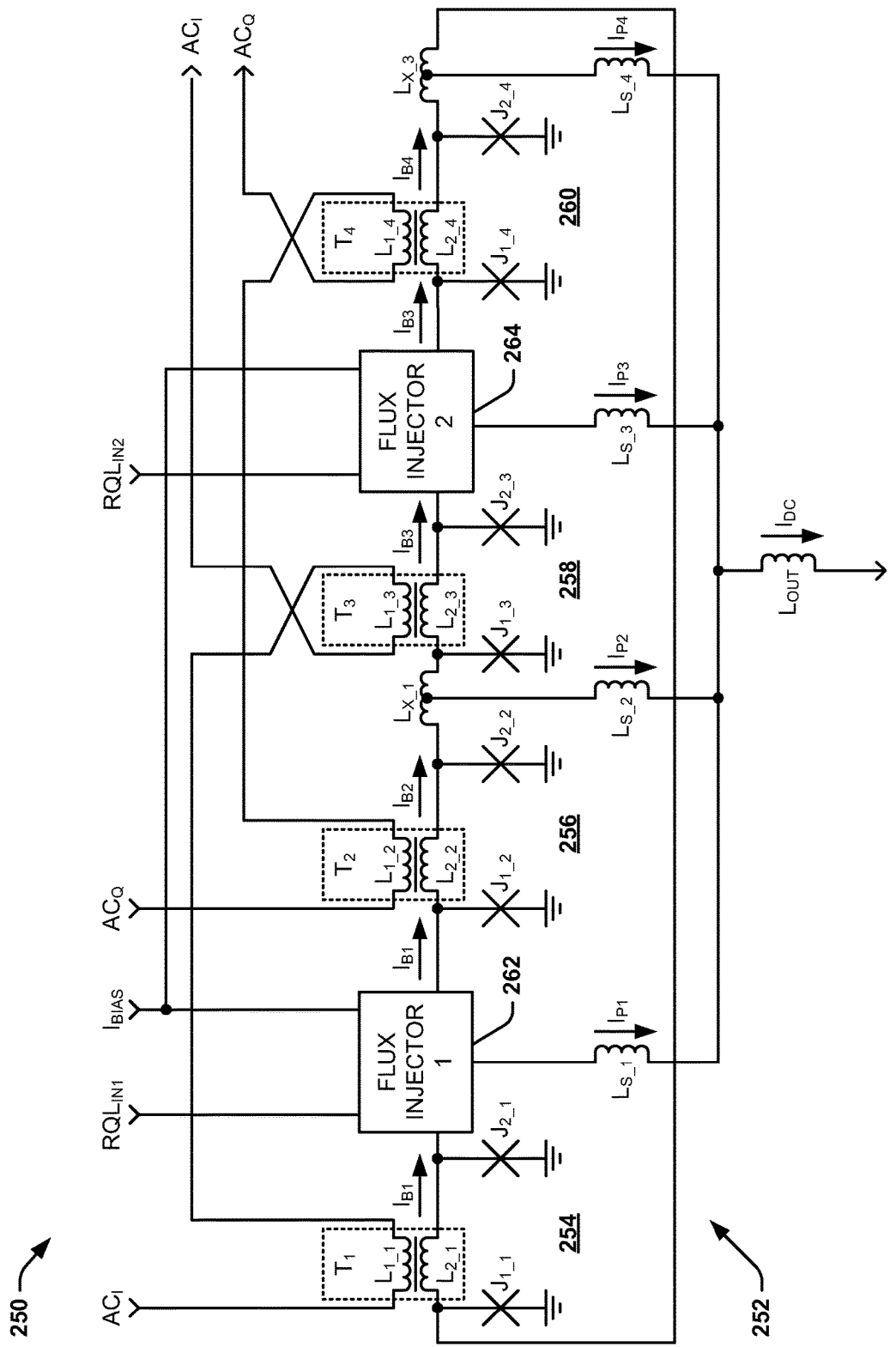
FIG. 6 illustrates another example of a Josephson current source circuit.

FIG. 6 illustrates an example of a Josephson current source circuit 250. The Josephson current source circuit 250 can correspond to the Josephson current source 14 in the superconducting circuit system 10. Therefore, the Josephson current source circuit 250 includes a flux-shuttle loop 252 that includes a plurality of stages, similar to as described previously regarding the example of FIG. 2. In the example of FIG. 6, the stages are demonstrated as a first stage 254, a second stage 256, a third stage 258, and a fourth stage 260 that are sequentially coupled to form a loop arrangement. The Josephson current source circuit 250 is configured to generate the DC output current $I_{DC}$ through an output inductor $L_{OUT}$ based on an in-phase clock signal $AC_I$ and a quadrature-phase clock signal $AC_Q$.

Each of the stages 254, 256, 258, and 260 are configured substantially similarly with respect to each other and with the stages 54, 56, 58, and 60 in the Josephson current source circuit 50 in the example of FIG. 2. Therefore, the circuit components in the Josephson current source circuit 250 are demonstrated as having the same label designations as the circuit components in the Josephson current source circuit 50 in the example of FIG. 2. However, as opposed to the Josephson current source circuit 50 in the example of FIG. 2, the Josephson current source circuit 250 includes a first flux injector 262 and a second flux injector 264. The first and second stages 254 and 256 are interconnected by the first flux injector 262, the second and third stages 256 and 258 are interconnected by the inductor $L_{X\_1}$, the third and fourth stages 258 and 260 are interconnected by the second flux injector 264, and the fourth and first stages 260 and 254 are interconnected by the inductor $L_{X\_3}$. As described herein, based on the operation of the first and second flux injectors 262 and 264, the Josephson current source circuit 250 can operate as a bipolar Josephson current source to selectively increase and decrease the amplitude of the DC output current $I_{DC}$.

Each of the first and second flux injectors 262 and 264 can be configured substantially similar to the flux injector 150 in the example of FIG. 4, and are each demonstrated as receiving the bias current $I_{BIAS}$. The first flux injector 262 receives an input signal $RQL_{IN1}$ and the second flux injector 264 receives an input signal $RQL_{IN2}$. The input signals $RQL_{IN1}$ and $RQL_{IN2}$ can each be provided to selectively activate and deactivate the flux-shuttle loop 252. As an example, the input signals $RQL_{IN1}$ and $RQL_{IN2}$ can each be provided as an SFQ pulse or a reciprocal SFQ pulse that can activate and deactivate the flux-shuttle loop 252, respectively. However, the flux injector 264 can be arranged to have an initial flux state of an associated SQUID (e.g., the SQUID 152) that is opposite the flux state of the associated SQUID of the flux injector 262.

Therefore, in response to the input signal $RQL_{IN1}$ being provided as the SFQ pulse, the flux state of the first flux injector 262 can reverse to introduce the fluxon into the flux-shuttle loop 252 to activate the flux-shuttle loop 252 to increase the amplitude of the DC output current $I_{DC}$. Similarly, in response to the input signal $RQL_{IN1}$ being provided as a reciprocal SFQ pulse, the flux state can again reverse to introduce the anti-fluxon into the flux-shuttle loop 252 in the same direction as the fluxon to deactivate the flux-shuttle loop to maintain the amplitude of the DC output current $I_{DC}$. However, based on the reverse configuration of the second flux injector 264 relative to the first flux injector 262, the second flux injector 264 can be configured to activate the flux-shuttle loop 252 to decrease the amplitude of the DC output current $I_{DC}$. For example, in response to the input signal $RQL_{IN2}$ being provided as the SFQ pulse while the flux-shuttle loop 252 is deactivated, the flux state of the second flux injector 264 can reverse (e.g., from the $-\Phi_0/2$ flux state to the $+\Phi_0/2$ flux state) to introduce the anti-fluxon into the flux-shuttle loop 252 to activate the flux-shuttle loop 252 to decrease the amplitude of the DC output current $I_{DC}$. Similarly, in response to the input signal $RQL_{IN2}$ being provided as a reciprocal SFQ pulse (e.g., half a clock cycle out-of-phase of the anti-fluxon), the flux state can again reverse (e.g., from the $+\Phi_0/2$ flux state to the $-\Phi_0/2$ flux state) to introduce the fluxon into the flux-shuttle loop 252 in the same direction as the anti-fluxon, such that the attractive force between the fluxon and anti-fluxon cause the fluxon and anti-fluxon to annihilate each other to deactivate the flux-shuttle loop to maintain the amplitude of the DC output current $I_{DC}$.

Figure 7:
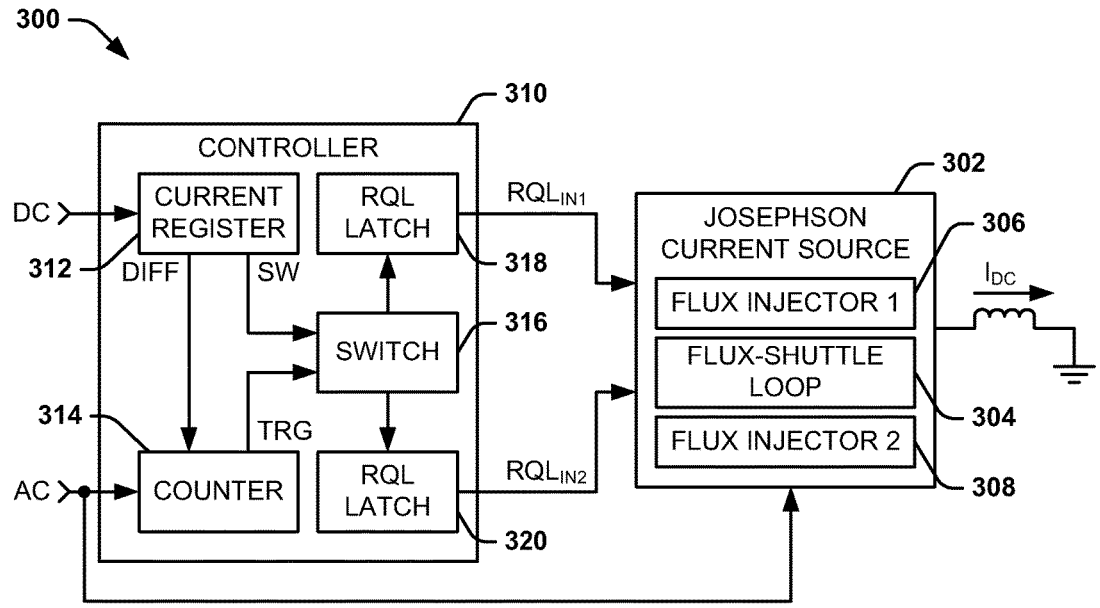
FIG. 7 illustrates an example of a Josephson current source system.

FIG. 7 illustrates an example of a Josephson current source system 300. As an example, the superconducting circuit system 300 can be implemented in any of a variety of quantum or classical computing applications, such as memory or processing systems. The superconducting circuit system 300 is configured to generate a DC output current, demonstrated in the example of FIG. 7 as a DC output current $I_{DC}$ that is provided via an output inductor $L_{OUT}$. As an example, the DC output current $I_{DC}$ can be provided as a power signal or as a driver signal, such as to drive a device (e.g., the device 12), such as based on an inductive coupling to the output inductor $L_{OUT}$.

The Josephson current source system 300 includes a Josephson current source 302 that is configured to generate the DC output current $I_{DC}$ in response to a clock signal AC that can correspond to a clock signal associated with the Josephson current source system 300. As an example, the clock signal AC can be a sinusoidal waveform having a substantially constant frequency (e.g., approximately 10 GHz) and a low AC current magnitude, such as applicable to RQL superconducting circuits. The Josephson current source 302 includes a flux-shuttle loop 304, a first flux injector 306, and a second flux injector 308. Therefore, the Josephson current source 302 can be configured substantially similar to the Josephson current source 250 in the example of FIG. 6. Accordingly, the Josephson current source 302 can be implemented to control the amplitude of the DC output current $I_{DC}$ by selectively increasing and decreasing the amplitude of the DC output current $I_{DC}$, similar to as described previously in the example of FIG. 6.

In the example of FIG. 7, the Josephson current source system 300 also includes a controller 310 that is configured to generate a first input signal $RQL_{IN1}$ and a second input signal $RQL_{IN2}$ to selectively activate and deactivate the flux-shuttle loop 304 to control the amplitude of the DC output current $I_{DC}$. The controller 310 includes a current register 312 configured to receive a digital signal DC having a value corresponding to a desired amplitude of the DC output current $I_{DC}$. The current register 312 can thus store the value of the digital signal DC. As an example, the current register 312 can be configured to identify a difference between the present amplitude of the DC output current $I_{DC}$ and the desired amplitude indicated by the digital signal DC, such that the current register 312 can be configured to identify whether the amplitude of the DC output current $I_{DC}$ is required to increase or decrease to become equal to the value of the digital signal DC. The current register 312 can thus provide a difference signal DIFF to a counter 314, with the difference signal DIFF corresponding to a difference between the present amplitude of the DC output current $I_{DC}$ and the desired amplitude indicated by the digital signal DC. Additionally, the current register 312 can provide a switch signal SW to a switch 316 that is configured to select between a first RQL latch 318 and a second RQL latch 320 that are configured to generate the first input signal $RQL_{IN1}$ and the second input signal $RQL_{IN2}$, respectively.

Thus, the current register 312 can be configured to enable the switch 316 via the switch signal SW to selectively activate the flux-shuttle loop 304 of the Josephson current source 302 to increase or decrease the DC output current $I_{DC}$, similar to as described previously regarding the Josephson current source 252 in the example of FIG. 2. For example, via the switch signal SW, the switch 316 can enable the first RQL latch 318 to provide the first input signal $RQL_{IN1}$ as an SFQ pulse to activate the flux-shuttle loop 304 via the first flux injector 306 to increase the DC output current $I_{DC}$. The switch 316 can also enable the first RQL latch 318 to provide the first input signal $RQL_{IN1}$ as a reciprocal SFQ pulse to deactivate the flux-shuttle loop 304 via the first flux injector 306 to maintain the DC output current $I_{DC}$ at a quiescent amplitude via the switch signal SW. Similarly, via the switch signal SW, the switch 316 can enable the second RQL latch 320 to provide the second input signal $RQL_{IN2}$ as a SFQ pulse to activate the flux-shuttle loop 304 via the second flux injector 308 to decrease the DC output current $I_{DC}$. The switch 316 can also enable the second RQL latch 320 to provide the second input signal $RQL_{IN2}$ as a reciprocal SFQ pulse to deactivate the flux-shuttle loop 304 via the second flux injector 308 to maintain the DC output current $I_{DC}$ at a quiescent amplitude via the switch signal SW.

The counter 314 can be configured to count clock cycles of the clock signal AC and to activate the first and second RQL latches 318 and 320 to control the increase and decrease of the amplitude of the DC output current $I_{DC}$ based on the difference signal DIFF. In the example of FIG. 7, the counter 314 is configured to provide a trigger signal TRG to the switch 316 to activate the first and second RQL latches 318 and 320 to provide the respective first and second input signals $RQL_{IN1}$ and $RQL_{IN2}$ at the appropriate times based on counting cycles of the clock signal AC and based on predetermined amplitude of the current increments provided to or from the output inductor $L_{OUT}$ at each clock cycle of the clock signal AC. Therefore, the counter 314 can control the timing of initiating the SFQ pulses and reciprocal SFQ pulses provided via the first and second input signals $RQL_{IN1}$ and $RQL_{IN2}$ to selectively activate and deactivate the flux-shuttle loop 304 to set the amplitude of the DC output current $I_{DC}$ to be approximately equal to the value of the digital signal DC based on the difference signal DIFF.

Accordingly, the Josephson current source circuit 250 and the Josephson current source system 300 respectively demonstrate programmable current sources that allow full amplitude control of the DC output current $I_{DC}$ by providing capability of both increasing and decreasing the amplitude of the DC output current $I_{DC}$ using a single flux-shuttle loop (e.g., the flux shuttle loops 252 and 304) by selectively providing a fluxon to the flux-shuttle loops 252 and 304 to increase the amplitude of the DC output current $I_{DC}$ and an anti-fluxon to the flux-shuttle loops 252 and 304 to decrease the amplitude of the DC output current $I_{DC}$. As described in greater detail herein, a Josephson current source system can implement separate respective flux-shuttle loops to implement full amplitude control of the DC output current $I_{DC}$, such as to alleviate potential cross-talk between the separate flux injectors (e.g., the flux injectors 262 and 264).

Figure 8:
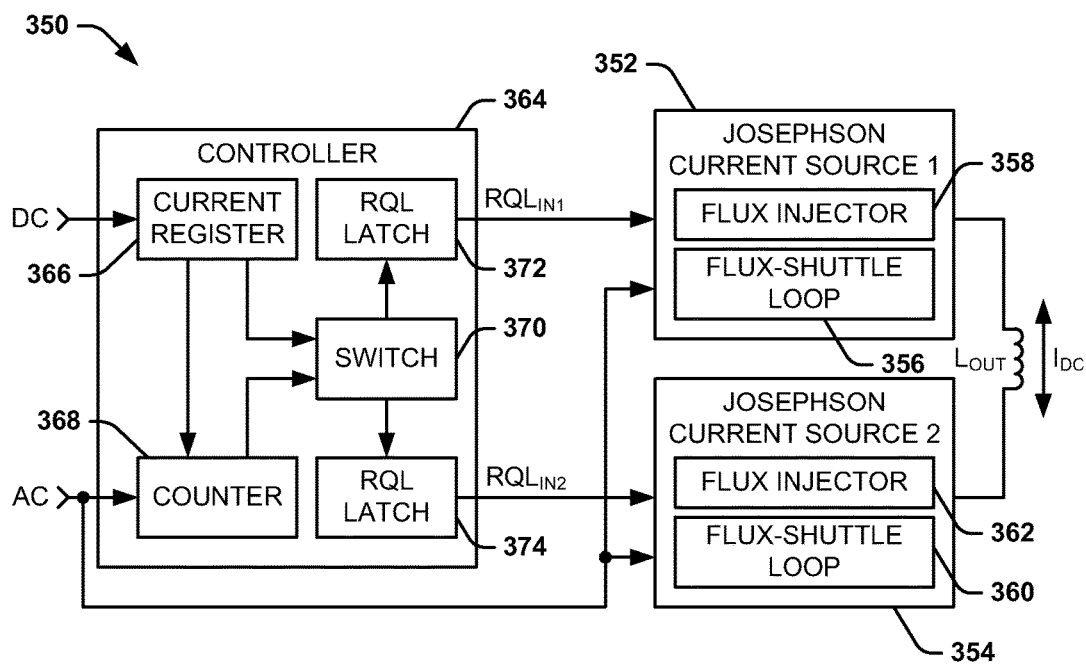
FIG. 8 illustrates another example of a Josephson current source system.

FIG. 8 illustrates an example of a Josephson current source system 350. As an example, the superconducting circuit system 350 can be implemented in any of a variety of quantum and classical computing applications, such as memory or processing systems. The superconducting circuit system 350 is configured to generate a DC output current, demonstrated in the example of FIG. 8 as a DC output current $I_{DC}$ that is provided via an output inductor $L_{OUT}$. As an example, the DC output current $I_{DC}$ can be provided as a power signal or as a driver signal, such as to drive a device (e.g., the device 12), such as based on an inductive coupling to the output inductor $L_{OUT}$.

The Josephson current source system 350 includes a first Josephson current source 352 and a second Josephson current source 354 that are each coupled on opposite sides of the output inductor $L_{OUT}$. Thus, the first and second Josephson current sources 352 and 354 are configured to generate the DC output current $I_{DC}$ in response to a clock signal AC that can correspond to a clock signal associated with the Josephson current source system 350. As an example, the clock signal AC can be a sinusoidal waveform having a substantially constant frequency (e.g., approximately 10 GHz) and a low AC current magnitude, such as applicable to RQL superconducting circuits. The first Josephson current source 352 includes a flux-shuttle loop 356 and a flux injector 358, and the second Josephson current source 354 includes a flux-shuttle loop 360 and a flux injector 362. Therefore, each of the first and second Josephson current sources 352 and 354 can be configured substantially similar to the Josephson current source 50 in the example of FIG. 2. Accordingly, each of the Josephson current sources 352 and 354 can be implemented to unidirectionally control the amplitude of the DC output current $I_{DC}$. However, based on the arrangement of the first and second Josephson current sources 352 and 354 with respect to the output inductor $L_{OUT}$, the first Josephson current source 352 can be configured to increase the amplitude of the DC output current $I_{DC}$ and the second Josephson current source 354 can be configured to decrease the amplitude of the DC output current $I_{DC}$, similar to as described previously in the example of FIG. 2.

In the example of FIG. 8, the Josephson current source system 350 also includes a controller 364 that is configured substantially similar to the controller 310 in the example of FIG. 7. The controller 364 includes a current register 366, a counter 368, a switch 370, a first RQL latch 372, and a second RQL latch 374, similar to as described previously in the example of FIG. 7. The current register 366 stores the value of the digital signal DC and provides the difference signal DIFF to the counter 368. Additionally, the current register 366 provides a switch signal SW to the switch 370 to select between enabling the first RQL latch 372 and the second RQL latch 374. For example, in response to the switch signal SW and the trigger signal TRG, the switch 370 can activate the flux-shuttle loop 356 via the flux injector 358 to increase the DC output current $I_{DC}$ via the first input signal $RQL_{IN1}$ provided as an SFQ pulse from the first RQL latch 372. Similarly, the switch 370 can deactivate the flux-shuttle loop 356 via the flux injector 358 to maintain the DC output current $I_{DC}$ via the first input signal $RQL_{IN1}$ provided as a reciprocal SFQ pulse from the first RQL latch 372. In addition, in response to the switch signal SW and the trigger signal TRG, the switch 370 can activate the flux-shuttle loop 360 via the flux injector 362 to decrease the DC output current $I_{DC}$ via the second input signal $RQL_{IN2}$ provided as an SFQ pulse from the second RQL latch 374. Similarly, the switch 370 can deactivate the flux-shuttle loop 360 via the flux injector 362 to maintain the DC output current $I_{DC}$ via the second input signal $RQL_{IN2}$ provided as a reciprocal SFQ pulse from the first RQL latch 372.

Accordingly, a pair of the Josephson current source circuits 50 implemented in the Josephson current source system 350 provides a programmable current source that allows full amplitude control of the DC output current $I_{DC}$ by providing capability of both increasing and decreasing the amplitude of the DC output current $I_{DC}$ using multiple flux-shuttle loops (e.g., a pair of flux shuttle loops 52) by selectively providing a fluxon to the respective flux-shuttle loops 52 to respectively increase and decrease the amplitude of the DC output current $I_{DC}$, and an anti-fluxon to the flux-shuttle loop 52 to maintain the amplitude of the DC output current $I_{DC}$. As a result, cross-talk between the separate flux injectors can be substantially mitigated.

Figure 9:
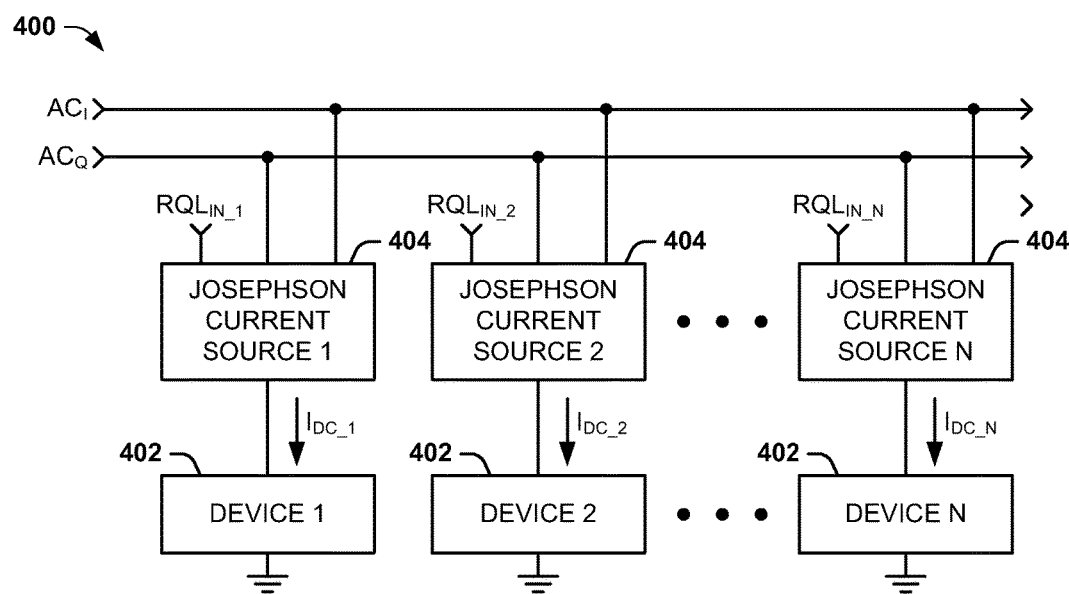
FIG. 9 illustrates an example of a superconducting circuit system.

As demonstrated in the examples of FIGS. 2 and 6, the in-phase clock signal $AC_I$ and the quadrature-phase clock signal $AC_Q$ are demonstrated as passing through the primary windings $L_{1\_1}$, $L_{1\_2}$, $L_{1\_3}$, and $L_{1\_4}$ of the transformers $T_1$, $T_2$, $T_3$, and $T_4$, respectively. However, the in-phase clock signal $AC_I$ and the quadrature-phase clock signal $AC_Q$ can, for example, be provided for a plurality of Josephson current sources, such as to generate a DC output current for a plurality of devices. FIG. 9 illustrates an example of a superconducting circuit system 400. As an example, the superconducting circuit system 400 can be implemented in any of a variety of quantum and classical computing applications, such as memory or processing systems. The superconducting circuit system 400 includes a plurality N of devices 402, where N is a positive integer. Each of the devices 402 receive a respective DC output current, demonstrated in the example of FIG. 9 as respective DC output currents $I_{DC\_1}$ through $I_{DC\_N}$ based on an AC input signal. As an example, the DC output currents $I_{DC\_1}$ through $I_{DC\_N}$ can be provided as power signals or as driver signals to drive the devices 402. For example, the devices 402 can each correspond to respective memory drivers, such as to provide read and write currents to an array of memory cells.

The superconducting circuit system 400 also includes a respective plurality of Josephson current sources 404 that are configured to generate the DC output currents $I_{DC\_1}$ through $I_{DC\_N}$. In the example of FIG. 9, the AC input signal is demonstrated as an in-phase clock signal $AC_I$ and a quadrature-phase clock signal $AC_Q$, such as demonstrated in the examples of FIGS. 2, 3, and 6. As an example, each of the Josephson current sources 404 can be configured substantially similar to the Josephson current source circuit 50 in the example of FIG. 2 or the Josephson current source circuit 250 in the example of FIG. 6, or as one of the Josephson current source systems 300 and 350 in the respective examples of FIGS. 7 and 8. Therefore, the Josephson current sources 404 can each include at least one flux-shuttle loop comprising four stages that are each configured substantially the same to propagate a fluxon around the loop to generate voltage pulses that are integrated into the respective DC output currents $I_{DC\_1}$ through $I_{DC\_N}$ via respective output inductors.

Each of the Josephson current sources 404 are also demonstrated as receiving at least one input signal $RQL_{IN\_1}$ through $RQL_{IN\_N}$ (e.g., with each including a first input signal $RQL_{IN1}$ and a second input signal $RQL_{IN2}$) that can be provided to the Josephson current source 404 to control the operation of the Josephson current sources 404 to convert the in-phase clock signal $AC_I$ and the quadrature-phase clock signal $AC_Q$ to the DC output currents $I_{DC\_1}$ through $I_{DC\_N}$. Thus, each of the Josephson current sources 404 can be separately activated and deactivated, such that the Josephson current sources 404 can be independently controlled to provide separate amplitudes of the DC output currents $I_{DC\_1}$ through $I_{DC\_N}$. Additionally, while the Josephson current sources 404 are arranged in parallel in the example of FIG. 9, it is to be understood that the Josephson current sources 404 can instead be arranged in series, such as to collectively generate a single DC output current having a higher slew rate.

Similar to as described previously, the Josephson current sources 404 can therefore operate to generate the DC output currents $I_{DC\_1}$ through $I_{DC\_N}$ based on the in-phase clock signal $AC_I$ and the quadrature-phase clock signal $AC_Q$ in a power efficient manner and with independent control. The Josephson current sources 404 only dissipate power via the voltage pulses to provide the respective DC output currents $I_{DC\_1}$ through $I_{DC\_N}$ to the devices 402, such that no additional power is dissipated to maintain the fluxon propagating around the flux-shuttle loop in each of the Josephson current sources 404. In addition, the Josephson current sources 404 can generate substantially no heat from static power dissipation, as opposed to typical resistance-based DC power sources. Accordingly, the Josephson current sources 404 can operate efficiently and effectively in the superconducting circuit system 400.

Figure 10:
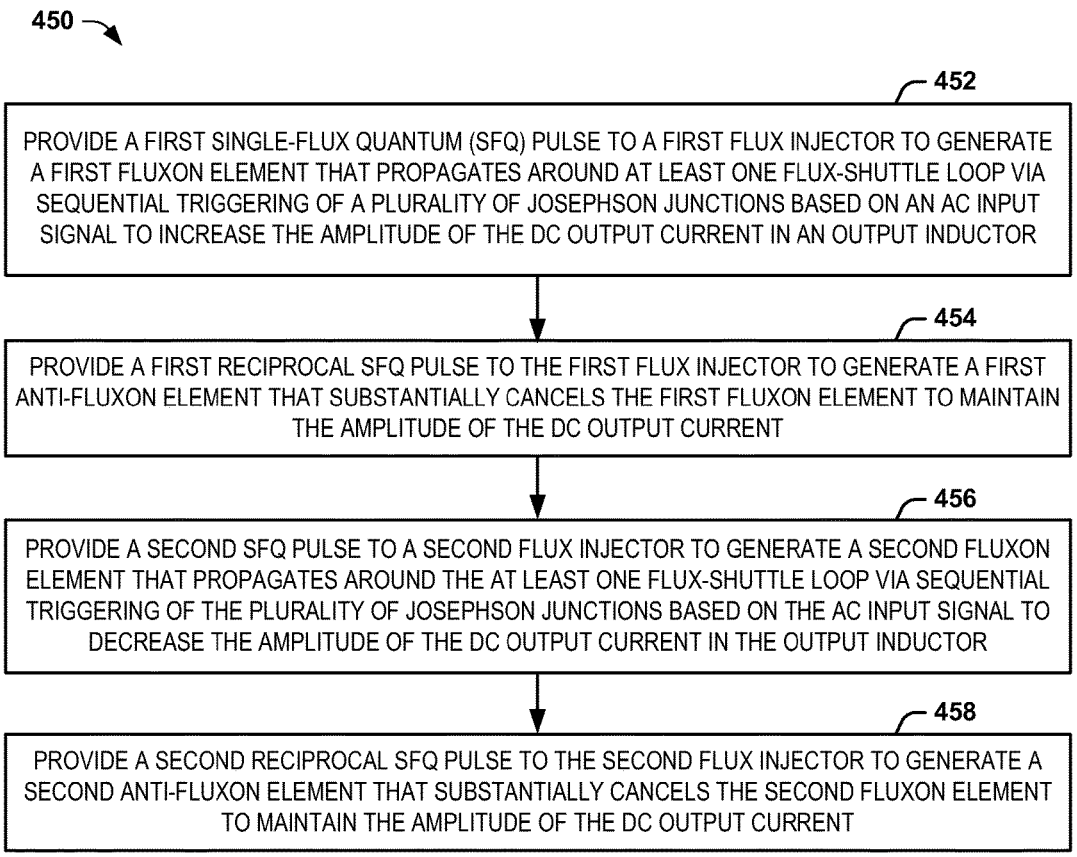
FIG. 10 illustrates an example of a method for controlling an amplitude of a DC output current.

In view of the foregoing structural and functional features described above, a methodology in accordance with various aspects of the present invention will be better appreciated with reference to FIG. 10. While, for purposes of simplicity of explanation, the methodology of FIG. 10 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 10 illustrates an example of a method 450 for controlling an amplitude of a DC output current (e.g., the DC output current $I_{DC}$). At 452, a first SFQ pulse (e.g., via the input signal $RQL_{IN}$) is provided to a first flux injector (e.g., one of the flux injectors 306 and 358) to generate a first fluxon that propagates around at least one flux-shuttle loop (e.g., the flux shuttle loop 252 or the flux shuttle loop 52) via sequential triggering of a plurality of Josephson junctions (e.g., the Josephson junctions $J_{1\_1}$, $J_{2\_1}$, $J_{1\_2}$, $J_{2\_2}$, $J_{1\_3}$, $J_{2\_3}$, $J_{1\_4}$, and $J_{2\_4}$) based on an AC input signal (e.g., the clock signal AC) to increase the amplitude of the DC output current in an output inductor (e.g., the output inductor $L_{OUT}$). At 454, a first reciprocal SFQ pulse is provided (e.g., via the input signal $RQL_{IN}$) to the first flux injector to generate a first anti-fluxon that substantially cancels the first fluxon to maintain the amplitude of the DC output current. At 456, a second SFQ pulse is provided (e.g., via the input signal $RQL_{IN}$) to a second flux injector (e.g., one of the flux injectors 308 and 362) to generate a second fluxon that propagates around the at least one flux-shuttle loop via sequential triggering of the plurality of Josephson junctions based on the AC input signal to decrease the amplitude of the DC output current in the output inductor. At 458, a second reciprocal SFQ pulse is provided (e.g., via the input signal $RQL_{IN}$) to the second flux injector to generate a second anti-fluxon that substantially cancels the second fluxon to maintain the amplitude of the DC output current.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A Josephson current source system comprising:
   a flux-shuttle loop comprising a plurality of Josephson junctions spaced about the flux-shuttle loop and being configured to sequentially trigger the plurality of Josephson junctions about the flux-shuttle loop, in response to an inductively-coupled AC input signal, to generate a DC output current provided through an output inductor; and
   a flux injector coupled to said flux-shuttle loop and configured to selectively activate and deactivate the flux-shuttle loop to control an amplitude of the DC output current.

2. The system of claim 1, wherein the flux injector is configured to activate the flux-shuttle loop to initiate sequential triggering of the plurality of Josephson junctions about the flux-shuttle loop in response to a single-flux quantum (SFQ) pulse, and is configured to deactivate the flux-shuttle loop in response to reciprocal SFQ pulse.

3. The system of claim 1, wherein flux-shuttle loop comprises a superconducting quantum interference device (SQUID) comprising a flux state corresponding to one of activation and deactivation of the flux-shuttle loop, and wherein the flux injector is configured to change the flux state in response to an input signal to one of activate and deactivate the flux-shuttle loop.

4. The system of claim 3, wherein the SQUID comprises a SQUID Josephson junction that forms part of the flux-shuttle loop, and wherein the flux injector further comprises a transformer comprising a first inductor configured to propagate a DC bias current, a second inductor that is magnetically coupled with the first inductor and is configured to propagate the input signal, and a third inductor that is magnetically coupled with the first and second inductors and which forms part of the SQUID, such that the SQUID Josephson junction triggers in response to the input signal to activate and deactivate the flux-shuttle loop.

5. The system of claim 4, wherein the flux-shuttle loop comprises a plurality of stages that are each associated with a respective phase of the AC input signal, wherein each of the plurality of stages comprises a storage inductor interconnecting the respective one of the plurality of stages with the output inductor and being configured to provide a voltage pulse to the output inductor to increase the DC output current in response to the sequential triggering of the plurality of Josephson junctions, wherein one of the plurality of stages comprises the flux injector, such that the third inductor is configured as the storage inductor associated with the respective one of the plurality of stages.

6. The system of claim 1, wherein the AC input signal comprises an in-phase AC input signal and a quadrature-phase AC input signal.

7. The system of claim 6, wherein the flux-shuttle loop further comprises a plurality of transformers configured to inductively couple the flux-shuttle loop with each of the in-phase AC input signal and the quadrature-phase AC input signal, wherein the in-phase AC input signal is provided through a primary winding of a first portion of the plurality of transformers to induce a bias current in a secondary winding of the first portion of the plurality of transformers, and wherein the quadrature-phase AC input signal is provided through a primary winding of a second portion of the plurality of transformers to induce a bias current in a secondary winding of the second portion of the plurality of transformers to facilitate the sequential triggering of the plurality of Josephson junctions.

8. The system of claim 1, wherein the flux-shuttle loop comprises a plurality of stages, wherein the flux injector is configured as one of the plurality of stages, each of the plurality of stages comprising:
   a transformer configured to generate a bias current based on inductive coupling of the AC input signal;
   a Josephson junction configured to trigger to generate a voltage pulse in response to the bias current; and
   a storage inductor interconnecting the respective one of the plurality of stages with the output inductor and being configured to provide the voltage pulse to the output inductor.

9. The system of claim 1, wherein the flux injector is a first flux injector that is configured to selectively activate and deactivate the flux-shuttle loop in response to a first input signal to selectively increase the amplitude of the DC output current based on sequential triggering of the plurality of Josephson junctions about the flux-shuttle loop when the flux-shuttle loop is activated by the first flux injector, the system further comprising a second flux injector that is configured to selectively activate and deactivate the flux-shuttle loop in response to a second input signal to selectively decrease the amplitude of the DC output current based on sequential triggering of the plurality of Josephson junctions about the flux-shuttle loop when the flux-shuttle loop is activated by the second flux injector.

10. A superconducting current source comprising the Josephson current source system of claim 1, wherein the Josephson current source system is configured to increase the amplitude of the DC output current in response to activation of the flux-shuttle loop, the superconducting current source further comprising:
   a controller configured to set the amplitude of the DC output current in response to a programmable current register and to generate a first input signal and a second input signal, the first input signal being provided to the flux injector to activate the flux-shuttle loop; and
   a second Josephson current source system comprising:
      a second flux-shuttle loop comprising a second plurality of Josephson junctions spaced about the second flux-shuttle loop and being configured, when activated, to sequentially trigger the second plurality of Josephson junctions about the second flux-shuttle loop in response to the inductively-coupled AC input signal to decrease the DC output current provided through the output inductor; and a second flux injector that is configured to selectively activate and deactivate the second flux-shuttle loop in response to the second input signal.

11. A superconducting circuit system comprising a plurality of the Josephson current source system of claim 1, the plurality of Josephson current source systems being configured to generate a respective plurality of DC output currents.

12. A method for controlling an amplitude of a DC output current, the method comprising:
providing a first single-flux quantum (SFQ) pulse to a first flux injector coupled to at least one flux-shuttle loop to generate a first fluxon that propagates around the at least one flux-shuttle loop via sequential triggering of a plurality of Josephson junctions based on an AC input signal to increase the amplitude of the DC output current in an output inductor coupled to the at least one flux-shuttle loop;
providing a first reciprocal SFQ pulse to the first flux injector to generate a first anti-fluxon that substantially cancels the first fluxon to maintain the amplitude of the DC output current;
providing a second SFQ pulse to a second flux injector coupled to the at least one flux-shuttle loop to generate a second fluxon that propagates around the at least one flux-shuttle loop via sequential triggering of the plurality of Josephson junctions based on the AC input signal to decrease the amplitude of the DC output current in the output inductor; and
providing a second reciprocal SFQ pulse to the second flux injector to generate a second anti-fluxon that substantially cancels the second fluxon to maintain the amplitude of the DC output current.

13. The method of claim 12, further comprising:
receiving a digital signal corresponding to a desired amplitude of the DC output current;
providing one of the first SFQ pulse and the second SFQ pulse to generate the respective one of the first fluxon and the second fluxon to one of increase and decrease the amplitude of the DC output current, respectively;
counting periods of the AC input signal, each period of the AC input signal corresponding to an increment of the amplitude of the DC output current; and
providing one of the first reciprocal SFQ pulse and the second reciprocal SFQ pulse to generate the respective one of the first anti-fluxon and the second anti-fluxon to maintain the amplitude of the DC output current in response to a quantity of periods of the AC input signal being sufficient for the DC output current to be approximately equal to the desired amplitude of the DC output current.

14. The method of claim 12, wherein providing the first SFQ pulse comprises providing the first SFQ pulse to the first flux injector to generate the first fluxon as a fluxon that propagates around a flux-shuttle loop, and wherein providing the second SFQ pulse comprises providing the second SFQ pulse to the second flux injector to generate the second fluxon as an anti-fluxon that propagates around the flux-shuttle loop.

15. The method of claim 12, wherein providing the first SFQ pulse comprises providing the first SFQ pulse to the first flux injector to generate the first fluxon as a fluxon that propagates around a first flux-shuttle loop, and wherein providing the second SFQ pulse comprises providing the second SFQ pulse to the second flux injector to generate the second fluxon as a fluxon that propagates around a second flux-shuttle loop, wherein the first and second flux-shuttle loops are coupled to the output inductor on opposite ends of the output inductor.

16. A Josephson current source system comprising:
a flux-shuttle loop comprising a plurality of Josephson junctions spaced about the flux-shuttle loop and being configured to sequentially trigger the plurality of Josephson junctions about the flux-shuttle loop in response to an inductively-coupled AC input signal to generate a DC output current provided through an output inductor; and
a flux injector comprising a superconducting quantum interference device (SQUID) having one of a first flux state and a second flux state, the flux injector being configured to change from the first flux state to the second flux state in response to a single-flux quantum (SFQ) pulse to activate the flux-shuttle loop to increase an amplitude of the DC output current, the flux injector being further configured to change from the second flux state to the first flux state in response to a reciprocal SFQ pulse to deactivate the flux-shuttle loop to maintain the amplitude of the DC output current.

17. The system of claim 16, wherein the SQUID comprises a SQUID Josephson junction that forms part of the flux-shuttle loop, and wherein the flux injector further comprises a transformer comprising a first inductor configured to propagate a DC bias current, a second inductor that is magnetically coupled with the first inductor and is configured to propagate the SFQ pulse and the reciprocal SFQ pulse, and a third inductor that is magnetically coupled with the first and second inductors and which forms part of the SQUID, such that the SQUID Josephson junction triggers in response to the SFQ pulse and the reciprocal SFQ pulse to activate and deactivate the flux-shuttle loop, respectively.

18. The system of claim 17, wherein the flux-shuttle loop comprises a plurality of stages that are each associated with a respective phase of the AC input signal, wherein each of the plurality of stages comprises a storage inductor interconnecting the respective one of the plurality of stages with the output inductor and being configured to provide a current increment to the output inductor to increase the DC output current in response to the sequential triggering of the plurality of Josephson junctions, wherein one of the plurality of stages comprises the flux injector, such that the third inductor is configured as the storage inductor associated with the respective one of the plurality of stages.

19. The system of claim 16, wherein the flux injector is a first flux injector that is configured to selectively activate and deactivate the flux-shuttle loop in response to a first SFQ pulse and a first reciprocal SFQ pulse, respectively, to selectively increase the amplitude of the DC output current based on sequential triggering of the plurality of Josephson junctions about the flux-shuttle loop when the flux-shuttle loop is activated by the first flux injector, the system further comprising a second flux injector that is configured to selectively activate and deactivate the flux-shuttle loop in response to a second SFQ pulse and a second reciprocal SFQ pulse, respectively, to selectively decrease the amplitude of the DC output current based on sequential triggering of the plurality of Josephson junctions about the flux-shuttle loop when the flux-shuttle loop is activated by the second flux injector.

20. A superconducting current source comprising the Josephson current source system of claim 16, wherein the Josephson current source system is configured to increase the amplitude of the DC output current in response to activation of the flux-shuttle loop, the superconducting current source further comprising:
- a controller configured to set the amplitude of the DC output current in response to a programmable current register and to generate a first SFQ pulse and a first reciprocal SFQ pulse associated with the Josephson current source system and a second SFQ pulse and a second reciprocal SFQ pulse; and
- a second Josephson current source system comprising:
  - a second flux-shuttle loop that is inductively coupled with the AC input signal, the second flux-shuttle loop comprising a second plurality of Josephson junctions spaced about the second flux-shuttle loop and being configured, when activated, to sequentially trigger the second plurality of Josephson junctions about the second flux-shuttle loop in response to the AC input signal to decrease the DC output current provided through the output inductor; and
  - a second flux injector comprising a second SQUID and which is configured to selectively activate and deactivate the second flux-shuttle loop in response to the second SFQ pulse and the second reciprocal SFQ pulse.

* * * * *